(12) United States Patent
Shirakawa

(10) Patent No.: US 9,136,007 B2
(45) Date of Patent: Sep. 15, 2015

(54) SEMICONDUCTOR MEMORY DEVICE STORING MANAGEMENT DATA REDUNDANTLY IN DIFFERENT PAGES

(71) Applicant: KABUSHIKI KAISHA TOSHIBA, Tokyo (JP)

(72) Inventor: Masanobu Shirakawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/015,980

(22) Filed: Aug. 30, 2013

(65) Prior Publication Data

US 2014/0286099 A1    Sep. 25, 2014

(30) Foreign Application Priority Data

Mar. 21, 2013    (JP) .................................. 2013-059126

(51) Int. Cl.
  *G11C 16/04*    (2006.01)
  *G11C 16/26*    (2006.01)
  *G11C 16/08*    (2006.01)
  *G11C 16/20*    (2006.01)
  *G11C 29/00*    (2006.01)

(52) U.S. Cl.
  CPC ............ *G11C 16/26* (2013.01); *G11C 16/0483* (2013.01); *G11C 16/08* (2013.01); *G11C 16/20* (2013.01); *G11C 29/82* (2013.01)

(58) Field of Classification Search
  USPC ......................... 365/185.12, 185.17
  See application file for complete search history.

(56) References Cited

U.S. PATENT DOCUMENTS

| | | | |
|---|---|---|---|
| 7,570,517 B2 | 8/2009 | Kwak et al. | |
| 2008/0052459 A1 | 2/2008 | Chang et al. | |
| 2011/0085385 A1 | 4/2011 | Park et al. | |
| 2013/0294165 A1* | 11/2013 | Park ..................... | 365/185.17 |
| 2014/0071756 A1* | 3/2014 | Iwai et al. ............... | 365/185.11 |

FOREIGN PATENT DOCUMENTS

| | | |
|---|---|---|
| JP | 2010-258289 A | 11/2010 |
| JP | 2011-133942 A | 7/2011 |
| JP | 2011-258289 A | 12/2011 |

OTHER PUBLICATIONS

Chinese Office Action datd May 4, 2015, filed in Chinese counterpart Application No. 102128725, 6 pages (with translation).

* cited by examiner

*Primary Examiner* — Hoai V Ho
(74) *Attorney, Agent, or Firm* — Patterson & Sheridan, LLP

(57) ABSTRACT

A semiconductor memory device includes a memory cell array that is capable of storing data in a nonvolatile manner, and a control section that controls data access to the memory cell array. The memory cell array stores the same data redundantly in a plurality of pages. The control section executes a reading operation on the plurality of pages that store the same data redundantly to read the data. The data that is stored redundantly may be management data or user data.

15 Claims, 25 Drawing Sheets

FIG. 19

| BLK | Flag |
|---|---|
| BLK0 | "0" |
| BLK1 | "1" |
| BLK2 | "1" |
| BLK3 | "0" |
| ⋮ | ⋮ |
| BLK(N-1) | "0" |

Flag="0": FEW MH OPENING DEFECTS
Flag="1": MANY MH OPENING DEFECTS

SEMICONDUCTOR MEMORY DEVICE STORING MANAGEMENT DATA REDUNDANTLY IN DIFFERENT PAGES

CROSS-REFERENCE TO RELATED APPLICATION

This application is based upon and claims the benefit of priority from Japanese Patent Application No. 2013-059126, filed Mar. 21, 2013, the entire contents of which are incorporated herein by reference.

FIELD

Embodiments described herein relate generally to a semiconductor memory device, a controller, and a memory system.

BACKGROUND

A NAND flash memory in which memory cells are arranged in a three-dimensional manner is known in the art.

DESCRIPTION OF THE DRAWINGS

FIG. 19 is a conceptual diagram of a flag table according to a fourth embodiment.

DETAILED DESCRIPTION

Figure 1:
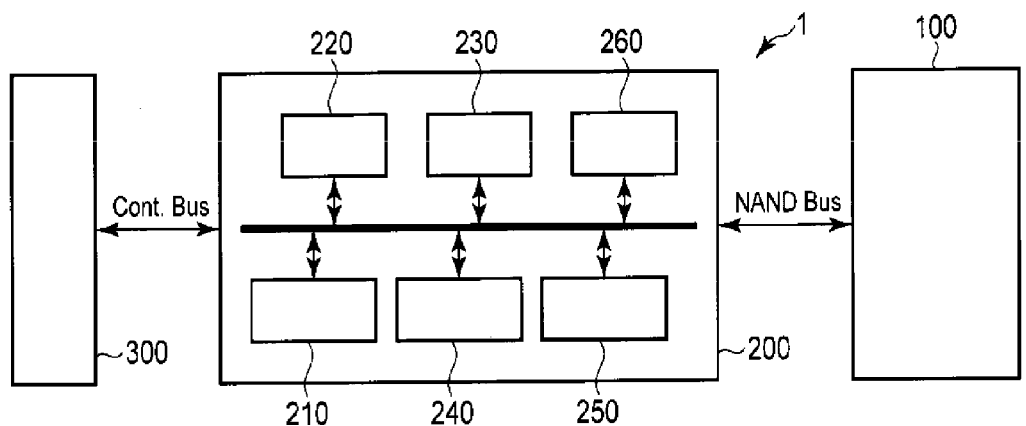
FIG. 1 is a block diagram illustrating a memory system according to a first embodiment.

Embodiments provide a semiconductor memory device, a controller and a memory system that are capable of enhancing operation reliability.

A semiconductor memory device according to an embodiment includes: a memory cell array that is capable of storing data in a nonvolatile manner; and a control section that controls data access to the memory cell array. The memory cell array stores the same data redundantly in a plurality of pages. The control section executes a reading operation on the plurality of pages that store the data redundantly to read the data. The data that is stored redundantly may be user data or management data.

Hereinafter, preferred embodiments will be described referring to the accompanying drawings. In the following description, the same reference numerals are given to the same components.

1. First Embodiment

A semiconductor memory device, a controller and a memory system according to a first embodiment will be described. Hereinafter, a 3D stacked NAND flash memory in which memory cells are stacked above a semiconductor substrate will be described as an example of the semiconductor memory device.

1.1 Configuration 1.1.1 Configuration of Memory System

First, a configuration of the memory system that includes the semiconductor memory device according to the present embodiment will be described referring to FIG. 1. FIG. 1 is a block diagram of the memory system according to the present embodiment.

As shown in FIG. 1, a memory system 1 includes a NAND flash memory 100, a controller 200, and a host device 300.

The NAND flash memory 100 includes plural memory cells and stores data in a nonvolatile manner. Details about a configuration of the NAND flash memory will be described later.

The controller 200 issues commands for reading, writing, erasing or the like to the NAND flash memory 100, in response to a command from the host device 300. Further, the controller 200 manages a memory space of the NAND flash memory 100. The controller 200 and the NAND flash memory 100 may form the same semiconductor device, for example. Further, the memory system 1 may be a single device. For example, a memory card such as an SD™ card, a solid state drive (SSD) or the like may be used. Further, the memory system 1 may have a configuration in which the NAND flash memory 100 and the controller 200 are implemented in a personal computer. Any system having the NAND flash memory 100 may be used.

The controller 200 includes a host interface circuit 210, a built-in memory (RAM) 220, a processor (CPU) 230, a buffer memory 240, a NAND interface circuit 250, and an ECC circuit 260.

The host interface circuit 210 is connected to the host device 300 through a controller bus, and communicates with the host device 300. Further, the host interface circuit 210 transmits commands and data received from the host computer 300 to the CPU 230 and the buffer memory 240, respectively. Further, the host interface circuit 210 transmits data in the buffer memory 240 to the host device 300 in response to a command from the CPU 230.

The NAND interface circuit 250 is connected to the NAND flash memory 100 through a NAND bus, and communicates with the NAND flash memory 100. Further, the NAND interface circuit 250 transmits commands received from the CPU 230 to the NAND flash memory 100, and transmits write data in the buffer memory 240 to the NAND flash memory 100 during writing. Further, the NAND interface circuit 250 transmits data read from the NAND flash memory 100 to the buffer memory 240 during reading.

The CPU 230 controls the entire operation of the controller 200. For example, when a reading command is received from the host device 300, the CPU 230 issues a reading command based on a NAND interface in response to the received reading command. This operation is similar for writing and erasing. Further, the CPU 230 executes various processes for managing the NAND flash memory 1, such as wear leveling. Further, the CPU 230 executes various calculations. For example, the CPU 230 executes a data encryption process, a randomization process or the like. The ECC circuit 260 executes a data error checking and correcting (ECC) process. That is, the ECC circuit 260 generates parity bits on the basis of write data during data writing, and generates syndrome bits from the parity bits during reading, to detect an error and to correct the error. The CPU 230 may have a function of the ECC circuit 260.

The built-in memory 220 is a semiconductor memory such as a DRAM, and is used as a work area of the CPU 230. Further, the built-in memory 220 retains firmware for management of the NAND flash memory 100, various management data or the like.

1.1.2 Configuration of Semiconductor Memory Device

Next, a configuration of the semiconductor memory device 100 will be described.

1.1.2.1 Overall Configuration of Semiconductor Memory device

Figure 2:
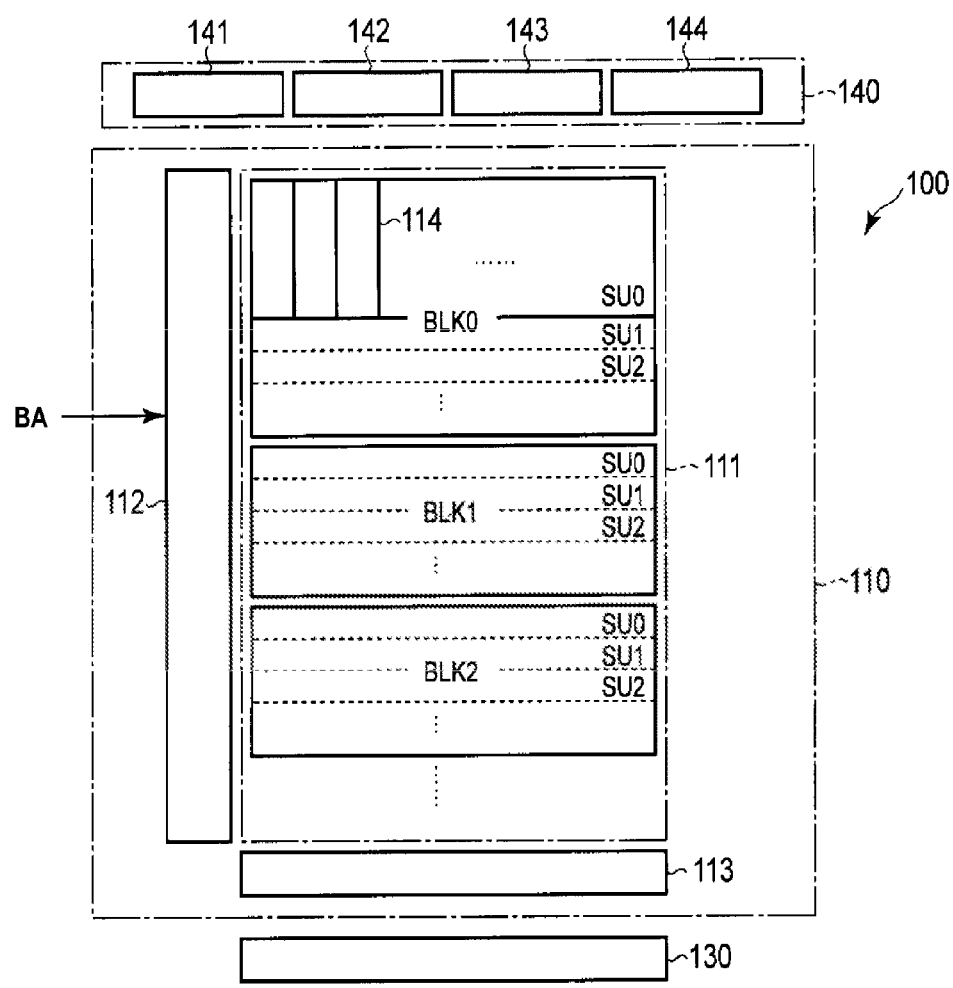
FIG. 2 is a block diagram illustrating a semiconductor memory device according to the first embodiment.

FIG. 2 is a block diagram of the NAND flash memory 100 according to the present embodiment. As shown in FIG. 2, the NAND flash memory 100 includes a core unit 110, an input and output unit 130 and a peripheral circuit 140.

The core unit 110 includes a memory cell array 111, a row decoder 112 and a sense amplifier 113.

The memory cell array 111 includes plural (for example, N) blocks BLK (BLK0, BLK1, BLK2, . . . ) that are a set of nonvolatile memory cells. Data in the same block BLK are erased as a unit, for example. Each of the blocks BLK includes plural (for example, M) string units SU (SU0, SU1, SU2, . . . ) that are a set of NAND strings 114 each of which includes memory cells connected in series. The number of blocks in the memory cell array 111 and the number of memory groups in the block are arbitrary. It is not necessary that data in the same block BLK are erased as a unit. For example, data in the same string unit SU may be erased as a unit.

The row decoder 112 decodes a block address BA received from the controller 200, selects a corresponding block BLK, and applies a voltage to a word line or a select gate line which will be described later.

The sense amplifier 113 senses and amplifies data read from the memory cell during data reading. Further, the sense amplifier 113 outputs the read data to the controller 200 as necessary. Further, during data writing, the sense amplifier 113 transmits write data received from the controller 200 to the memory cell. The data reading and writing with respect to the memory cell array 111 are performed for a plurality memory cells, known as a page.

The input and output unit 130 performs transmission and reception of various commands and data with the controller 200 through a NAND bus.

The peripheral circuit 140 includes a sequencer 141, a charge pump 142, a register 143, and a driver 144.

The driver 144 supplies voltage necessary for data writing, reading and erasing to the row decoder 112 or the sense amplifier 113. The voltage is applied to various wirings in the memory cell array 111. The charge pump 142 increases a power source voltage given from the outside and supplies a necessary voltage to the driver 144. The register 143 retains various signals. For example, the register 143 retains a status of a data writing or erasing operation, and accordingly notifies the controller of whether the operation is normally completed. The sequencer 141 controls the entire operation of the NAND flash memory 100.

1.1.2.2 Memory Cell Array 111

Figure 3:
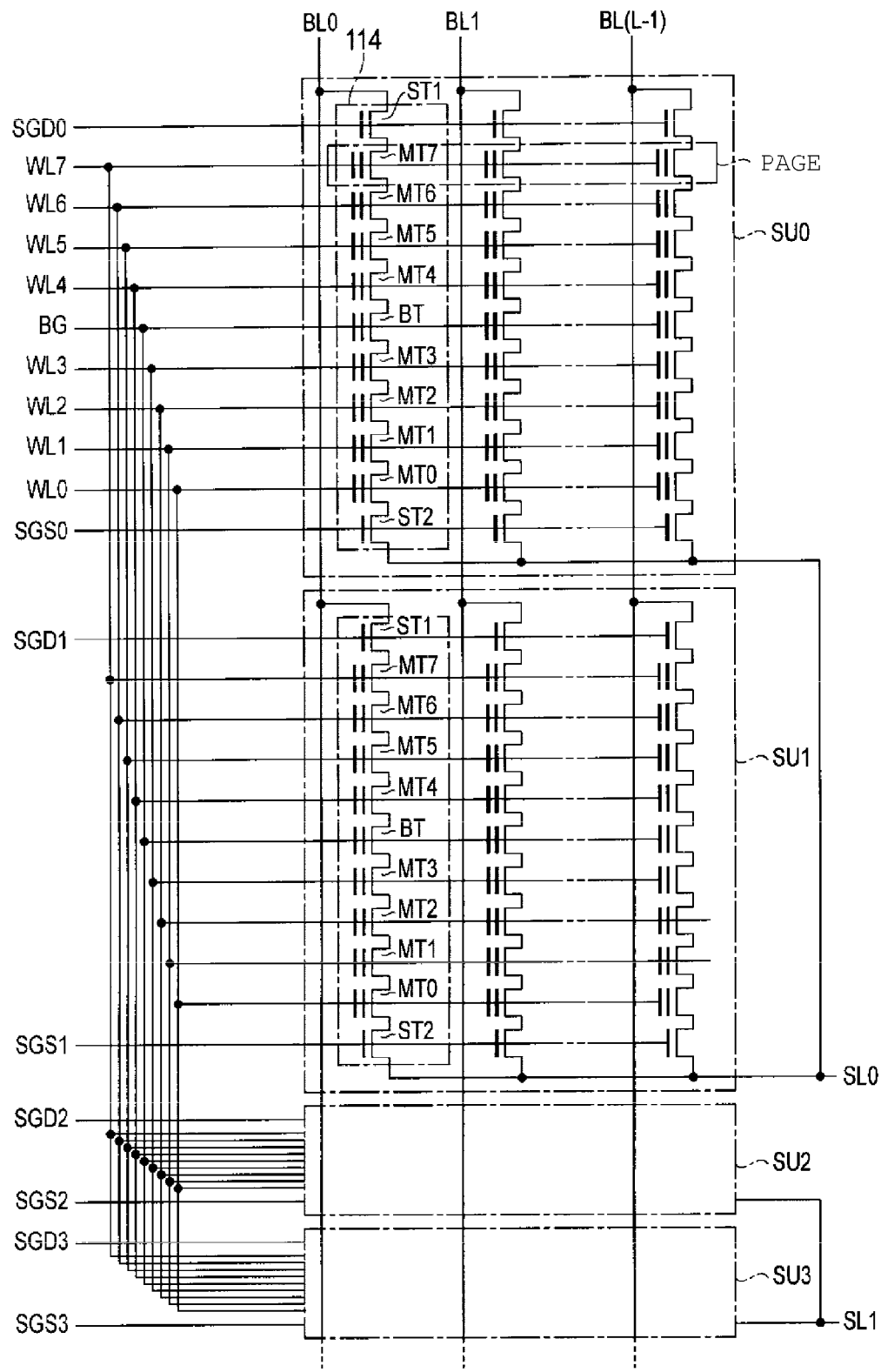
FIG. 3 is a circuit diagram of a memory cell array according to the first embodiment.

Next, a configuration of the memory cell array 111 will be described in detail. FIG. 3 is a circuit diagram of the block BLK0. The other blocks BLK have the same configuration.

As shown in FIG. 3, the block BLK0 includes the plural string units SU. Further, each of the string units SU includes plural (here, L) NAND strings 114.

Each of the NAND strings 114 includes eight memory cell transistors MT (MT0 to MT7), selection transistors ST1 and ST2, and a back gate transistor BT, for example. The memory cell transistor MT includes a stacked gate including a control gate and an electric charge accumulation layer, and retains data in a nonvolatile manner. The number of the memory cell transistors MT is not limited to eight, and may be 16, 32, 64, 128 or the like. The back gate transistor BT includes a stacked gate including a control gate and an electric charge accumulation layer, in a similar way to the memory cell transistor MT. However, the back gate transistor BT does not retain data, and functions as a current path during data writing and erasing. The memory cell transistors MT and the back gate transistor BT are arranged between the selection transistors ST1 and ST2 so that they are connected in series. The back gate transistor BT is provided between the memory cell transistors MT3 and MT4. A current path of the memory cell transistor MT7 on one end side of the serial connection is connected to one end of a current path of the selection transistor ST1, and a current path of the memory cell transistor MT0 on the other end side thereof is connected to one end of a current path of the selection transistor ST2.

Gates of the selection transistors ST1 of the string units SU0 to SU (M−1) are commonly connected to select gate lines SGD0 to SGD(M−1), respectively, and gates of the selection transistors ST2 are commonly connected to select gate lines SGS0 to SGS(M−1), respectively. On the other hand, control gates of the memory cell transistors MT0 to MT7 in the same block BLK0 are commonly connected to word lines WL0 to WL7, respectively, and control gates of the back gate transistors BT are commonly connected to a back gate line BG (BG0 to BG (N−1) in the blocks BLK0 to BLK(N−1)), respectively.

That is, the word lines WL0 to WL7 and the back gate BG are commonly connected between the plural string units SU in the same block BLK0, whereas the select gate lines SGD and SGS are independently provided in each string unit SU even in the same block BLK0.

Further, the other ends of the current paths of the selection transistors ST1 of the NAND strings 114 disposed on the same column among the NAND strings 114 that are arranged in a matrix form in the memory cell array 110 are commonly connected to a bit line BL. That is, the bit line BL is commonly connected to the plural NAND strings 114 in the same block BLK, and is commonly connected to the NAND strings 114 between the plural blocks BLKs. Further, the other ends of the current paths of the selection transistors ST2 are connected to a source line SL. The source line SL is commonly connected to the NAND strings 114 between plural string units SU, for example.

As described above, data in the memory cell transistors MT in the same block BLK are erased as a unit. On the other hand, data reading and writing are performed for a plurality memory cell transistors MT that are commonly connected to a word line WL in any string unit SU of any block BLK. The unit is known as a "page".

In the memory cell array 111 with such a configuration, the memory cell transistors MT, the selection transistors ST1 and ST2 and the back gate transistor BT are stacked above a semiconductor substrate in a three-dimensional manner. For example, a part of a peripheral circuit of the sense amplifier 113 may be formed on the semiconductor substrate, and the memory cell array 111 may be formed above the peripheral circuit.

The configuration of the memory cell array 111 is disclosed in U.S. patent application Ser. No. 12/407,403 filed on Mar. 19, 2009 "Three dimensional stacked nonvolatile semiconductor memory", for example. This configuration is also disclosed in U.S. patent application Ser. No. 12/406,524 "Three dimensional stacked nonvolatile semiconductor memory" filed on Mar. 18, 2009, U.S. patent application Ser. No. 12/679,991 "Nonvolatile semiconductor memory device and method for manufacturing the same" filed on Mar. 25, 2010, and U.S. patent application Ser. No. 12/532,030 "Semiconductor memory and method for manufacturing the same" filed on Mar. 23, 2009. These patent applications are incorporated by reference in the present specification in their entirety.

1.1.2.3 Sense Amplifier 113

Figure 4:
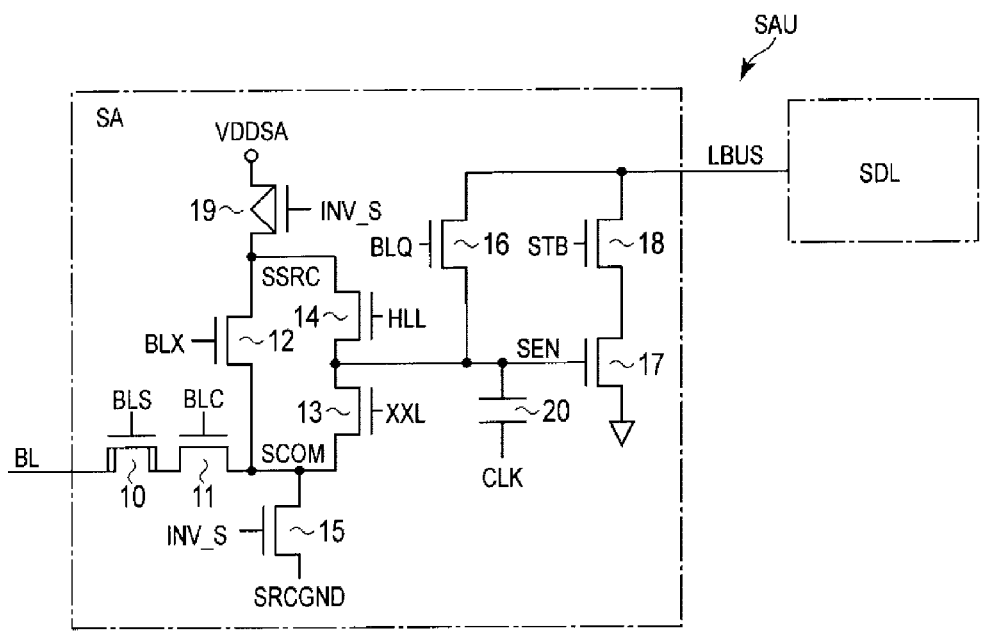
FIG. 4 is a circuit diagram of a sense amplifier according to the first embodiment.

Next, the sense amplifier 113 will be described. The sense amplifier 113 includes a sense amplifier unit SAU for each bit line. FIG. 4 is a circuit diagram of the sense amplifier unit SAU.

As shown in FIG. 4, the sense amplifier unit SAU includes a sense amplifying part SA and a latch circuit SDL. For example, when each memory cell transistor retains 2 or more bit data, two or more latch circuits are provided.

The sense amplifying part SA senses and amplifies data read from the bit line BL, and applies voltage to the bit line BL according to data retained by the latch circuit SDL. That is, the sense amplifying part SA is a module that directly controls the bit line BL. The latch circuit SDL temporarily retains the data. The latch circuit SDL retains write data received from the controller 200 through the input and output circuit 130 during data writing. The latch circuit SDL retains the data sensed and amplified by the sense amplifying part SA during data reading, and transmits the result to the controller 200 through the input and output circuit 130.

As shown in FIG. 4, the sense amplifying part SA includes a high breakdown voltage n-channel MOS transistor 10, low breakdown voltage n-channel MOS transistors 11 to 18, a low breakdown voltage p-channel MOS transistor 19, and a capacitor element 20.

The transistor 10 has a gate to which a signal BLS is applied, and one end of a current path connected to a corresponding bit line BL. The transistor 11 has one end of a current path connected to the other end of the current path of the transistor 10, a gate to which a signal BLC is applied, and the other end of the current path connected to a node SCOM. The transistor 11 is configured to clamp the corresponding bit line BL to an electric potential based on the signal BLC.

The transistor 15 has one end of a current path connected to the node SCOM, the other end connected to a node SRCGND (for example, 0 V), and a gate connected to a node INV_S. The transistor 12 has one end of a current path connected to the node SCOM, the other end connected to a node SSRC, and a gate to which a control signal BLX is input. The transistor 19 has one end of a current path connected to the node SSRC, the other end to which a source voltage VDDSA is applied, and a gate connected to the node INV_S. The transistor 13 has one end of a current path connected to the node SCOM, the other end connected to a node SEN, and a gate to which a control signal XXL is input. The transistor 14 has one end of a current path connected to the node SSRC, the other end connected to the node SEN, and a gate to which a control signal HLL is input.

The transistor 17 has one end of a current path that is ground, and a gate connected to the node SEN. The transistor 18 has one end of a current path connected to the other end of the current path of the transistor 17, the other end connected to a bus LBUS, and a gate to which a control signal STB is input. The transistor 16 has one end of a current path connected to the node SEN, the other end connected to the bus LBUS, and a gate to which a control signal BLQ is input. The capacitor element 20 has one electrode connected to the node SEN, and the other electrode to which a clock CLK is input.

Next, an operation of the sense amplifying part SA during reading will be simply described. First, the signals BLS, BLC and BLX are set to an "H" level, the node INV_S is set to an "L" level, and the bit line is pre-charged to an electric potential Vbl. Further, as the signal HLL is set to the "H" level, the capacitor element 20 is charged, and the electric potential of the node SEN rises.

Then, the signal HLL is set to the "L" level, and the signal XXL is set to the "H" level, and thus, data sensing is performed. That is, if a selected cell is turned on and a cell current flows to the source line SL from the bit line BL, the node SEN is discharged, and the electric potential of the node SEN is reduced. On the other hand, if the selected cell is turned off, the node SEN is not discharged, and the initial electric potential is maintained nearly as it is.

Further, the signal STB is set to the "H" level, and data is strobed. That is, read data is transmitted to the latch circuit SDL. Specifically, if the electric potential of the node SEN is the "H" level, the transistor 17 is turned on, and the "L" level is transmitted to the latch circuit SDL through the node LBUS. On the other hand, if the electric potential of the node SEN is reduced, the transistor 17 is turned off, and the node LBUS maintains the "H" level of the initial state. Accordingly, the latch circuit SDL maintains a reset state that retains the "H" level.

1.2 ROM Fuse

Next, a ROM fuse of the NAND flash memory 100 according to the present embodiment will be described.

Figure 5:
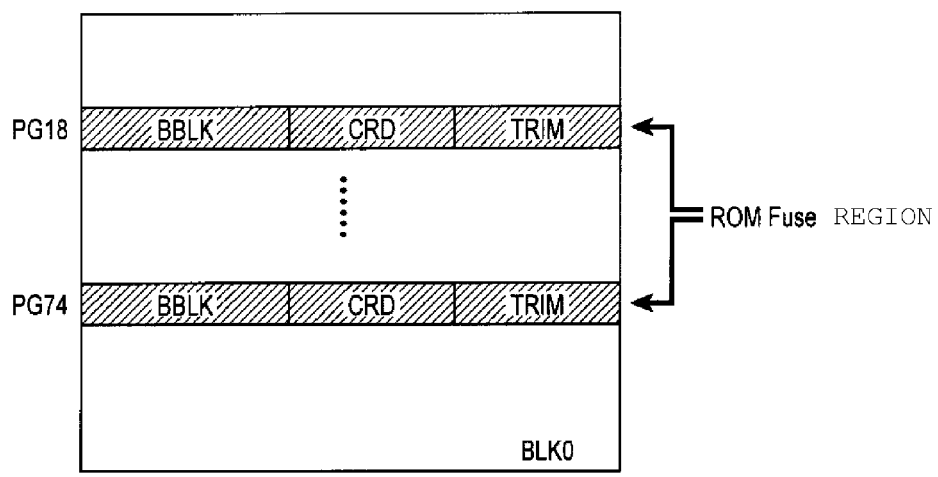
FIG. 5 is a schematic diagram of a block of memory cells according to the first embodiment.

The ROM fuse is a region where information unique to the NAND flash memory 100 is retained and access from the outside is prohibited. FIG. 5 is a conceptual diagram of ROM fuse regions.

As shown in FIG. 5, in the present example, the block BLK0 is used as a ROM fuse block. Here, for example, pages PG18 and PG74 are used as ROM fuse regions. Further, for example, bad block information BBLK, column redundancy information CRD, and trimming information TRIM are stored in the ROM fuse regions.

The bad block information BBLK is information relating to a bad block (block that is unusable), and includes a block address of the bad block, for example. The column redundancy information CRD is information about replacement of a defective column (column including a defective bit line, a sense amplifier defect or the like), and includes, for example, column addresses of the defective column and a normal column with which the defective column is replaced. The trimming information TRIM is information that indicates manufacturing variation between chips or between manufacturing lots and to optimize voltage setting or the like per chip or per manufacturing lot. The above mentioned information is collectively referred to as ROM fuse information.

The ROM fuse information is stored in the page PG18 and the page PG74, and these pages PG18 and PG74 retain the same ROM fuse information.

Figure 6:
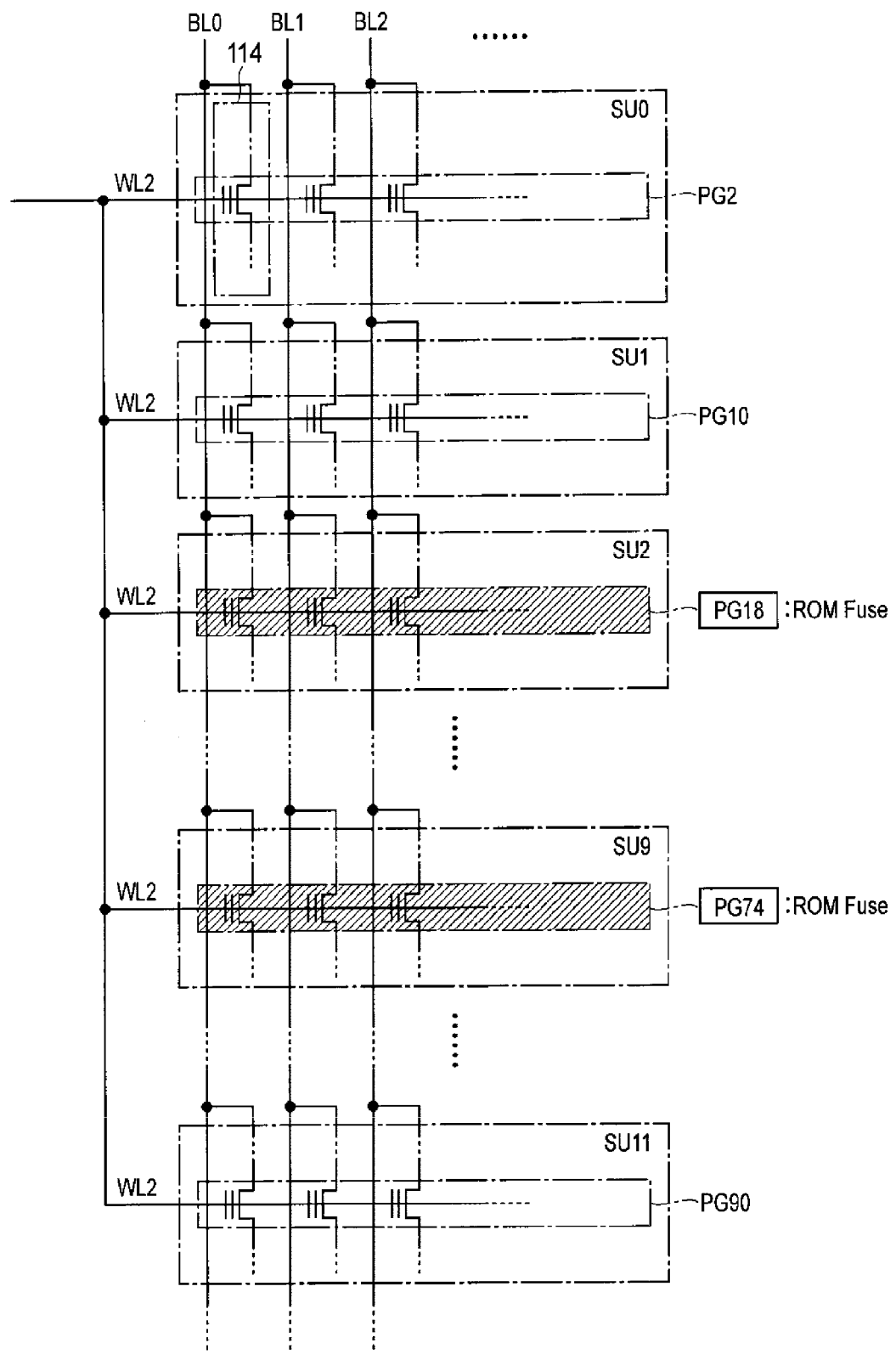
FIG. 6 is a circuit diagram of a block of memory cells according to the first embodiment.

FIG. 6 specifically shows a configuration of a ROM fuse block BLK0. In FIG. 6, a case is shown where twelve string units SU in the block BLK0 are included, the number of word lines in each string unit SU is eight, and each memory cell transistor MT retains 1-bit data.

As shown in FIG. 6, the page PG18 is a set of memory cell transistors MT connected to the word line WL2 in the string unit SU2. Further, the page PG74 is a set of memory cell transistors MT connected to the word line WL2 in the string unit SU9. That is, two pages PG18 and PG74 used as the ROM fuse regions correspond to pages allocated to the same word line WL2.

The word line WL is commonly used in the string units SU0 to SU11 in the same block. Accordingly, pages PG2, PG10, PG90 or the like other than the pages PG18 and PG74 are allocated to the word line WL2. On these pages, the ROM fuse information may be written in a similar way to the pages PG18 and PG74. Further, the same ROM fuse information may be written on the entire twelve pages allocated to the word line WL2.

The above-described relationship between the word line WL and the page PG is only an example. For example, if the memory cell transistor MT retains 2-bit data, two pages including a high-order page and a low-order page corresponding to a high bit and a low bit of the 2-bit data are allocated to one word line. Accordingly, the number of pages in one block is two times the number of pages in the above-mentioned case, and the pages PG used as the ROM fuse regions may be also different from the case in FIG. 6. This is similarly applied to a case where the memory cell transistor MT retains 3 or more bit data.

Figure 7:
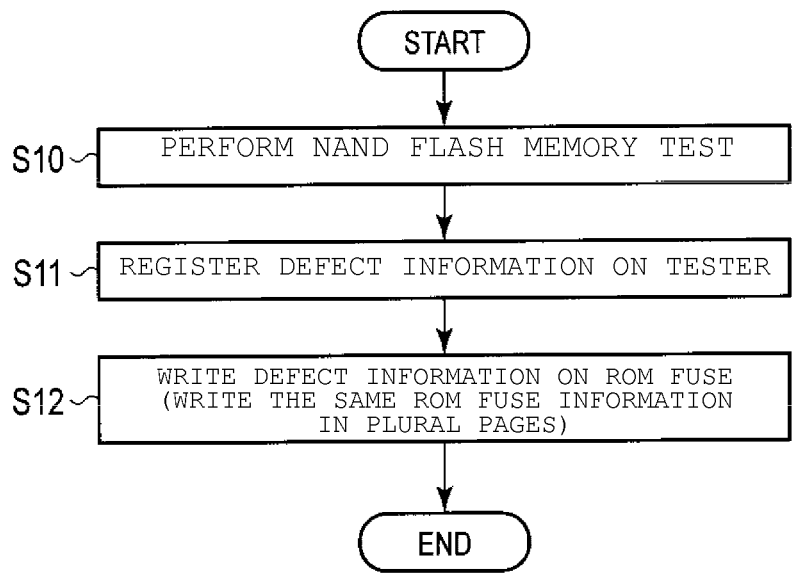
FIG. 7 is a flowchart illustrating an operation of a tester according to the first embodiment.

Writing of the ROM fuse information is performed during test before shipping of the NAND flash memory 100. FIG. 7 is a flowchart of a test method of the NAND flash memory 100 performed by a tester.

As shown in FIG. 7, the tester executes various tests with respect to the NAND flash memory 100 (step S10). These tests include a test for checking the presence or absence of a short circuit or an opening defect in wirings. The defect included in the NAND flash memory 100 is specified through the test.

Then, the tester registers defect information on a memory in the tester on the basis of the test result obtained in step S10 (step S11). More specifically, the tester registers a block incapable of a normal operation in the tester as a bad block even though using an ECC correction or redundancy technique. Further, if the defective column can be relieved using the redundancy technique, the defective column and the redundancy column obtained by relieving the defective column are registered in the tester.

Finally, the tester writes the defect information obtained in step S11 in any block as the ROM fuse information (step S12). In the case of the present example, as described referring to FIGS. 5 and 6, the same ROM fuse information is written in at least two pages PG18 and PG74 in the ROM fuse block. This writing operation may be performed for each page at different times, or may be performed for two pages at the same time. When the writing operation is performed on two pages at the same time, in the example in FIG. 6, select gate lines SGD2 and SGD9 are simultaneously selected, for example. In this state, a program voltage is applied to the word line WL2. As described above, the same ROM fuse information may be written over the entire twelve pages allocated to the word line WL2 in the example in FIG. 6. In this case, for example, all of the select gate lines SGD1 to SGD11 may be simultaneously selected, or may be sequentially selected.

1.3 Operation of NAND Flash Memory 100

Figure 8:
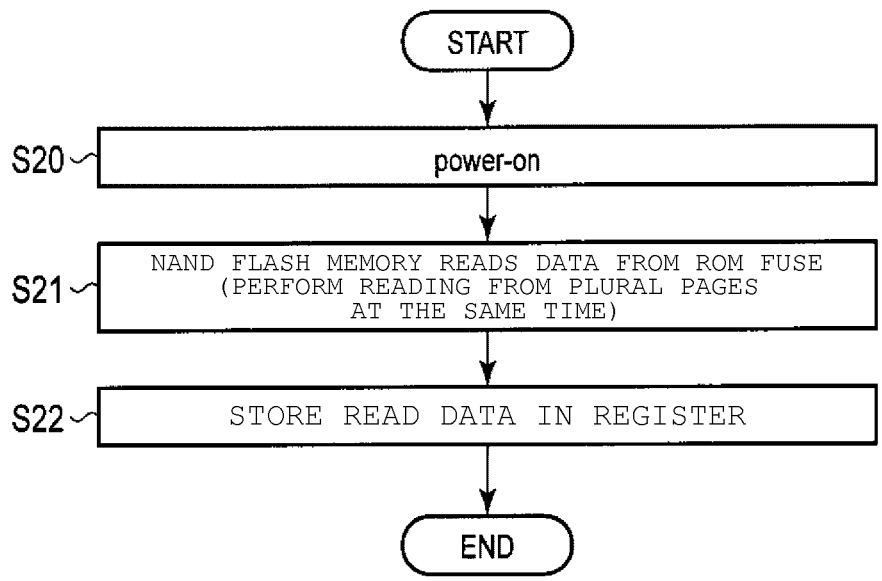
FIG. 8 is a flowchart illustrating an operation when electric power is supplied, according to the first embodiment.

Next, an operation of the NAND flash memory 100 immediately after electric power is supplied will be described referring to FIG. 8. FIG. 8 is a flowchart of an operation of the NAND flash memory 100.

As shown in FIG. 8, the NAND flash memory 100 starts up as electric power is supplied by the controller 200 (step S20). When a command from the controller 200 is not received by the started-up NAND flash memory 100, a boot sequence is executed by the sequencer 141.

That is, the sequencer 141 reads data from the ROM fuse (step S21: power-on reading (POR)). As described above referring to FIGS. 5 and 6, the ROM fuse includes the two pages PG18 and PG74. Accordingly, the sequencer 141 reads ROM fuse information from the two pages PG18 and PG74.

Further, the sequencer 141 stores the read ROM fuse information in the register 143 (step S22).

Figure 9:
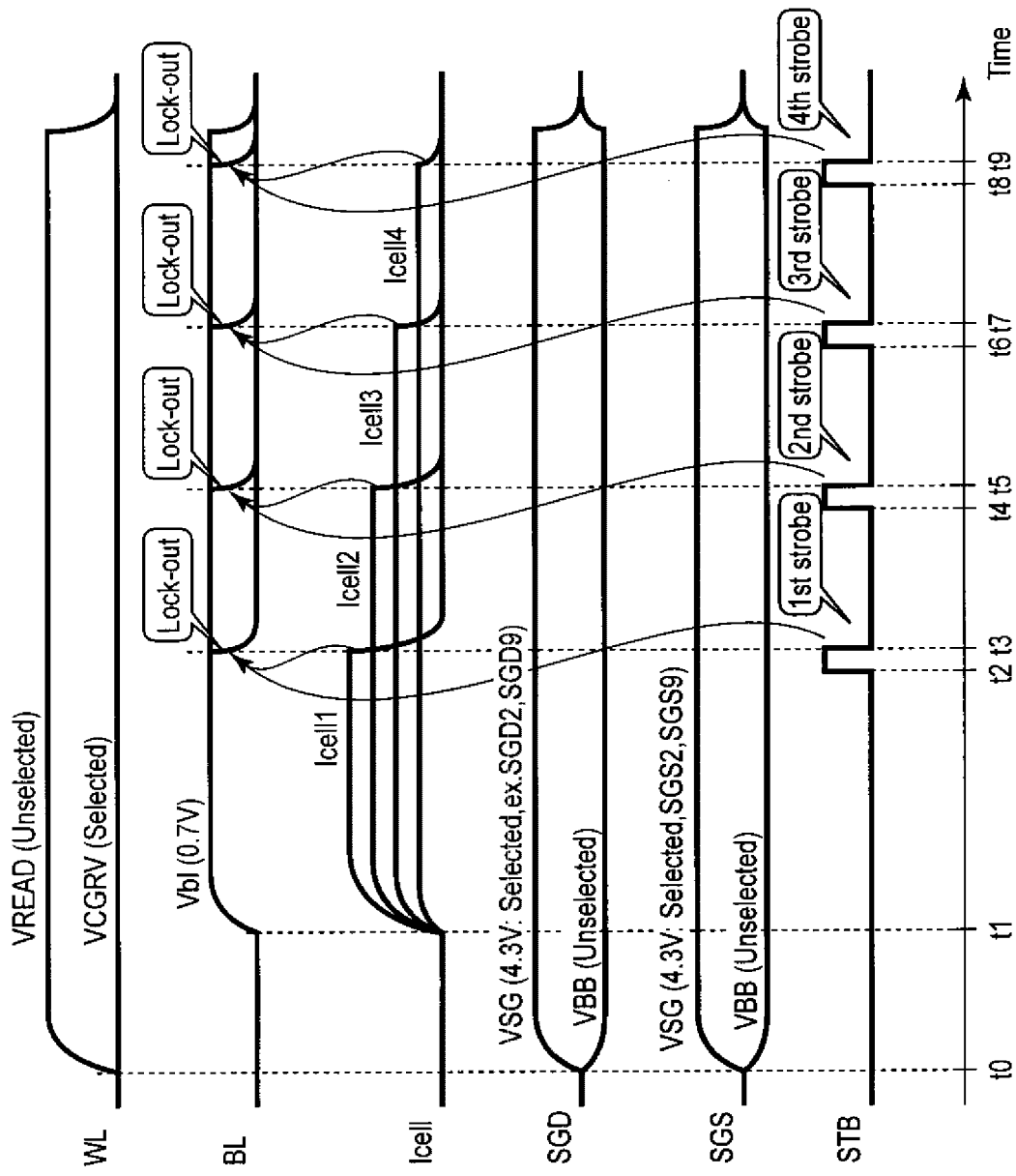
FIG. 9 is a timing chart of various signals when a reading operation is performed, according to the first embodiment.

Details about the step S21 will be described referring to FIG. 9. FIG. 9 is a timing chart of various wirings and control signals when the ROM fuse information is read. This reading operation is executed as the sequencer 141 controls the control signals, for example.

As shown in FIG. 9, at a time point t0, the sequencer 141 applies an "H" level (VSG: for example, 4.3 V) to the select gate line SGD of the string unit SU in which the ROM fuse information is written, and applies an "L" level (VBB: for example, a negative voltage) to the other select gate lines SGD. In the example shown in FIGS. 5 and 6, the "H" level is given to the select gate lines SGD2 and SGD9. Further, the sequencer 141 applies a voltage VCGRV to a selected word line, and applies a voltage VREAD to a non-selected word line. The voltage VCGRV is a value corresponding to data that is a read target, and if the memory cell transistor retains 1-bit data, VCGRV=0 V, for example. The voltage VREAD is a voltage that turns on the memory cell transistor regardless of the retained data. In the example shown in FIGS. 5 and 6, the VCGRV is given to the word line WL2, and the VREAD is applied to the other word lines WL0, WL1, and WL3 to WL7. The "H" level is also applied to the back gate line BG. Further, the sequencer 141 applies an "H" level (VSG) to select gate lines SGS of the string unit SU in which signal ROM fuse information is written, and applies an "L" level (VBB) to the other select gate lines SGS. In the example shown in FIGS. 5 and 6, the "H" level is given to the select gate lines SGS2 and SGS9.

Then, at a time point t1, the sequencer 141 starts precharging of the bit line BL. That is, the sequencer 141 sets the signals BLS, BLC and BLX to an "H" level, and sets the node INV_S to an "L" level. Thus, the bit line BL is pre-charged to the voltage Vbl (for example, 0.7V). Further, the signal HLL is set to an "H" level, to charge the node SEN.

Further, a cell current Icell flows to the source line SL from the bit line BL according to the ROM fuse information. That is, if data retained in a memory cell transistor (selected cell) connected to a selected word line is "1", that is, if the selected cell is turned on, the cell current Icell flows to the source line SL from the bit line BL. On the other hand, if the retained data is "0" and the selected cell is turned off, the cell current Icell does not flow, and only a low off current Ioff flows.

Here, the size of the cell current Icell that flows in one bit line BL is generally classified into four values Icell1, Icell2, Icell3 and Icell4 as shown in FIG. 9, for example. The size of the currents is as follows: Icell>Icell2>Icell3>Icell4. It should be understood that pillar widths of different memory strings may vary, e.g., due to manufacturing differences, and that larger currents flow through the memory strings having larger pillar widths. As a result, current flows through different memory strings vary according to the pillar widths thereof.

It may be possible that there is another reason why the current flows through different memory strings vary.

The current Icell1 flows in a bit line when both of two selected cells connected to one bit line BL retain "1" data, an opening defect is not generated in the current paths of the NAND strings 114, and at least one NAND string 114 has the largest pillar width to cause electric current to flow therethrough easily.

The current Icell2 flows in a bit line when both of two selected cells connected to one bit line BL retain "1" data, an opening defect is not generated in the current paths of the NAND strings 114, and two NAND strings 114 have the second largest pillar width to cause electric current to flow therethrough less easily than through the NAND string with the largest pillar width.

The current Icell3 flows in a bit line when both of two selected cells connected to one bit line BL retain "1" data, an opening defect is not generated in the current paths of the NAND strings 114, and two NAND strings 114 have the third largest pillar width to cause electric current to flow therethrough less easily than through the NAND string with the second largest pillar width. Alternatively, the current Icell3 flows in a bit line when both of two selected cells connected to one bit line BL retain "1" data, an opening defect is present in the current path of the one NAND string 114 that includes any one selected cell, and the other NAND string 114 has the third largest pillar width to cause electric current to flow therethrough less easily than through the NAND string with the second largest pillar width.

The current Icell4 flows in a bit line when both of two selected cells connected to one bit line BL retain "1" data, an opening defect is present in the current path of the one NAND string 114 that includes any one selected cell, and the other NAND string has the smallest pillar width to cause electric current to flow therethrough with the most resistance.

Hereinafter, for ease of description, a case where bit lines BL1 to BL4 respectively cause the cell currents Icell to Icell4 to flow will be described as a simple example.

Then, the sequencer 141 sets the signal HLL to the "L" level, and sets the signal XXL to the "H" level. Thus, read data is sensed. That is, in the sense amplifying part SA corresponding to the bit line BL where the selected cell is turned on, the node SEN is discharged by the cell current Icell. The discharging depends on the size of the cell current Icell. On the other hand, if the selected cell is turned off, the electric potential of the node SEN is set to a high level.

Next, the sequencer 141 strobes data. That is, at a time point t2 in FIG. 9, the sequencer 141 sets the signal STB to an "H" level. Then, the transistor 18 is turned on, and data based on whether the transistor 17 is turned on or turned off is transmitted to the latch circuit SDL through the bus LBUS. That is, if the node SEN is sufficiently discharged, the transistor 17 is turned off, and the node LBUS maintains the "H" level of the initial state. On the other hand, if the node SEN is not sufficiently discharged, the transistor 17 is turned on, and the "L" level is output to the node LBUS.

Further, at a time point t3, the sequencer 141 sets the signal STB to the "L" level, and locks out the bit line BL where the cell current Icell flows. In other words, the sequencer 141 fixes the electric potential of the bit line BL where the transistor 17 is turned on at the time point t2 to the same electric potential (for example, 0 V) as that of the source line SL, for example. Further, data on the bit line BL is settled as a strobe at the time point t2. In this example, the bit line BL1 is set to 0 V, and the other bit lines BL2 to BL4 are continuously pre-charged.

With respect to the other bit lines BL, the sense operation is repeated again. That is, at a time point t4 when a first period elapses from the time point t3, the sequencer 141 sets the signal STB to the "H" level again. Further, at a time point t5, the sequencer 141 locks out the bit line BL where the cell current Icell2 flows. In this example, the bit line BL2 is locked out. Further, data on the bit line BL2 is settled as a strobe at the time point t4. The other bit lines BL3 and BL4 are continuously pre-charged.

The sequencer 141 repeats the sense operation again. That is, at a time point t6 when a second period elapses from the time point t5, the sequencer 141 sets the signal STB to the "H" level again. Further, at a time point t7, the sequencer 141 locks out the bit line BL where the cell current Icell3 flows. In this example, the bit line BL3 is locked out. Further, data on the bit line BL3 is settled as a strobe at the time point t6. The remaining bit line BL4 is continuously pre-charged.

The sequencer 141 repeats the sense operation again. That is, at a time point t8 when a third period elapses from the time point t7, the sequencer 141 sets the signal STB to the "H" level again. This is a final strobe operation in one reading operation. Thus, the sequencer 141 strobes data on the bit line BL4 where the cell current Icell4 flows.

Then, as the sequencer 141 performs a recovery operation, each wiring is reset to 0 V, for example.

1.4 Effect According to the Present Embodiment

According to the configuration according to the present embodiment, it is possible to improve operation reliability of the NAND flash memory. This effect will be described below.

Figure 10:
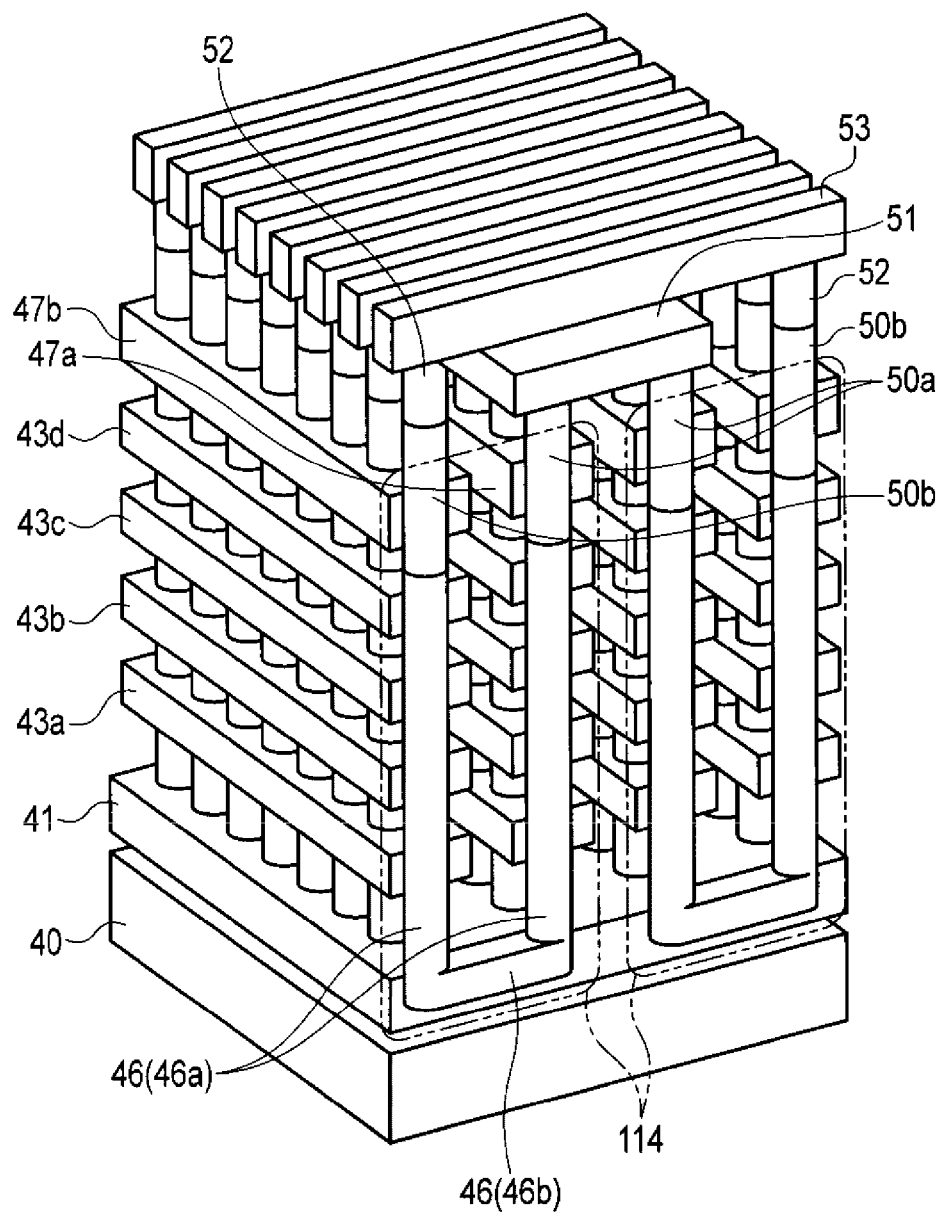
FIG. 10 is a perspective view of a memory cell array.

In a NAND flash memory where memory cells are stacked in a three-dimensional manner, an opening defect of a memory hole (hereinafter, referred to as an MH opening defect) is easily generated. First, description thereof will be briefly made. FIG. 10 is a perspective view of a configuration example of a memory cell array of a 3D stacked NAND flash memory.

As shown in FIG. 10, a back gate line 41 is formed above a semiconductor substrate 40, word line layers 43a to 43d are formed above the back gate line 41, and select gate line layers 47a and 47b are formed above the word line layer 43d. Further, semiconductor layers 46, 50a, 50b and 52 that function as current paths of the NAND strings 114 are formed to pass through these conductive layers 43a to 43d, 47a and 47b thereof. Although not shown, a gate insulating film, a block insulating film and the like are formed to surround the semiconductor layers 46, 50a and 50b. The semiconductor layers 46, 50a, 50b and 52 form a U shape as a whole, and a source line layer 51 and a bit line layer 53 are formed to be in contact with opposite ends thereof.

Figure 11:
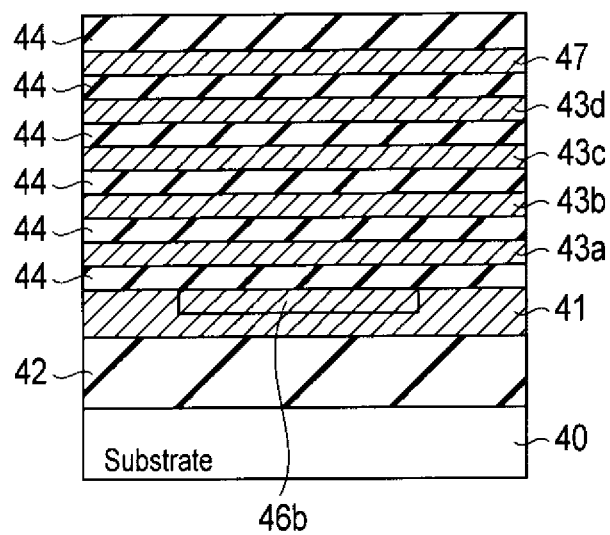
FIG. 11 is a cross-sectional view of a memory cell array.
Figure 12:
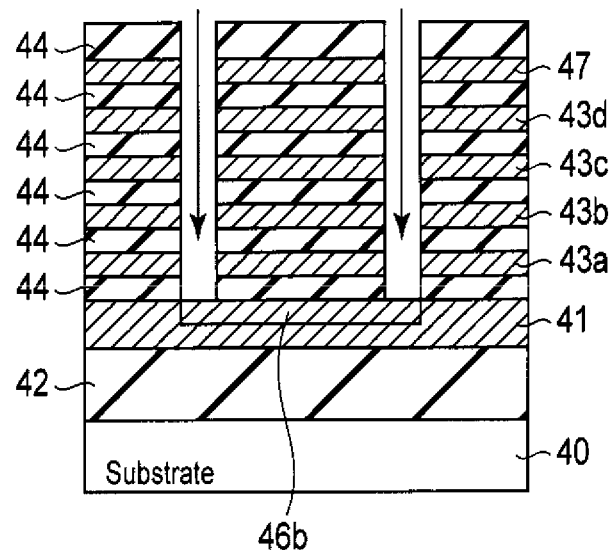
FIG. 12 is a cross-sectional view of a memory cell array during manufacturing.

The reason why the MH opening defect is easily generated in the memory cell of the present configuration will be described referring to FIGS. 11 and 12. FIGS. 11 and 12 show a part of a manufacturing process of a memory cell array.

First, as shown in FIG. 11, after a peripheral circuit such as a sense amplifier is formed above the semiconductor substrate 40, an inter-layer insulating film 42 is formed to coat the peripheral circuit. Then, the back gate line layer 41 and a semiconductor layer 46b are formed on an inter-layer insulating film 42. Further, inter-layer insulating films 44 and the semiconductor layers 43a to 43d are alternately formed on the back gate line layer 41 and the semiconductor layer 46b.

Next, as shown in FIG. 12, a hole (memory hole) that reaches the semiconductor layer 46b is formed through the inter-layer insulating films 44 and the semiconductor layers 43a to 43d. An electric charge accumulation layer, a block layer and a gate insulating film are formed on a side wall of the memory hole, and then, the memory hole is filled with a semiconductor layer 46a.

Figure 13:
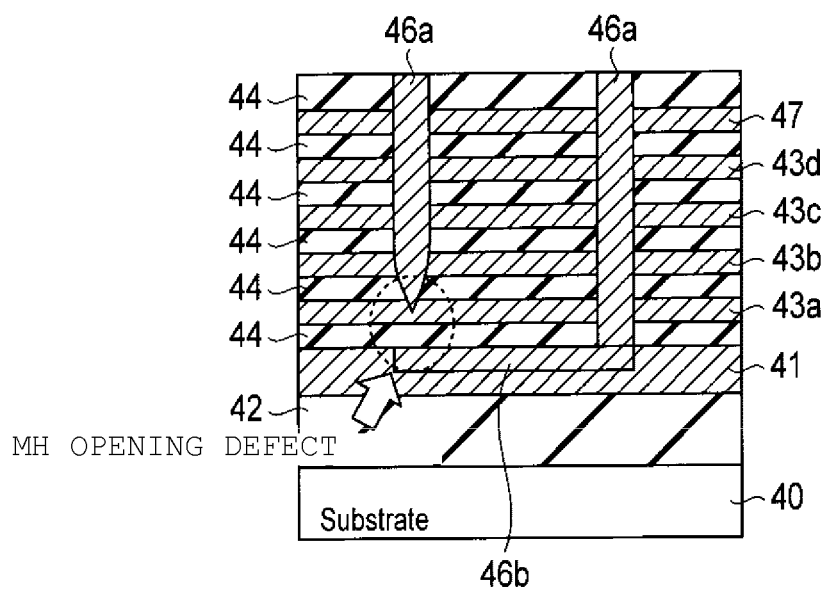
FIG. 13 is a cross-sectional view of a memory cell array having a memory hole opening defect.

However, if the number of layers of the semiconductor layers 43a to 43d is increased, the memory hole becomes deep. Then, it is difficult to form the memory hole at a depth that reaches the semiconductor layer 46b. This is shown in FIG. 13. FIG. 13 shows a state when the semiconductor layer 46a is buried in a memory hole. As shown in FIG. 13, if the memory hole does not reach the semiconductor layer 46b, the semiconductor layers 46a and 46b are separated from each other. This corresponds to the MH opening defect.

If the MH opening defect is generated, a cell current does not flow in the NAND string 114, regardless of data retained in a memory cell transistor. Accordingly, since the node SEN of the sense amplifying part SA is not discharged, it is determined that read data is "0" data (a state where a threshold value is high and a memory cell transistor is turned off) all the time.

This is similarly applied to verification in a write operation. That is, in a verifying operation after data is programmed, since it is determined that the memory cell transistor is turned off all the time, the data necessarily passes the verification regardless of the state of the memory cell transistor. That is, regardless of whether the original write data is "0", the data is not written due to the defect, and thus, it is determined that "0" data is correctly written even with respect to a memory cell transistor (program-failed bit) in which a threshold value thereof does not reach a value corresponding to "0" data. It is natural that wrong data is read from such a memory cell transistor.

Figure 14:
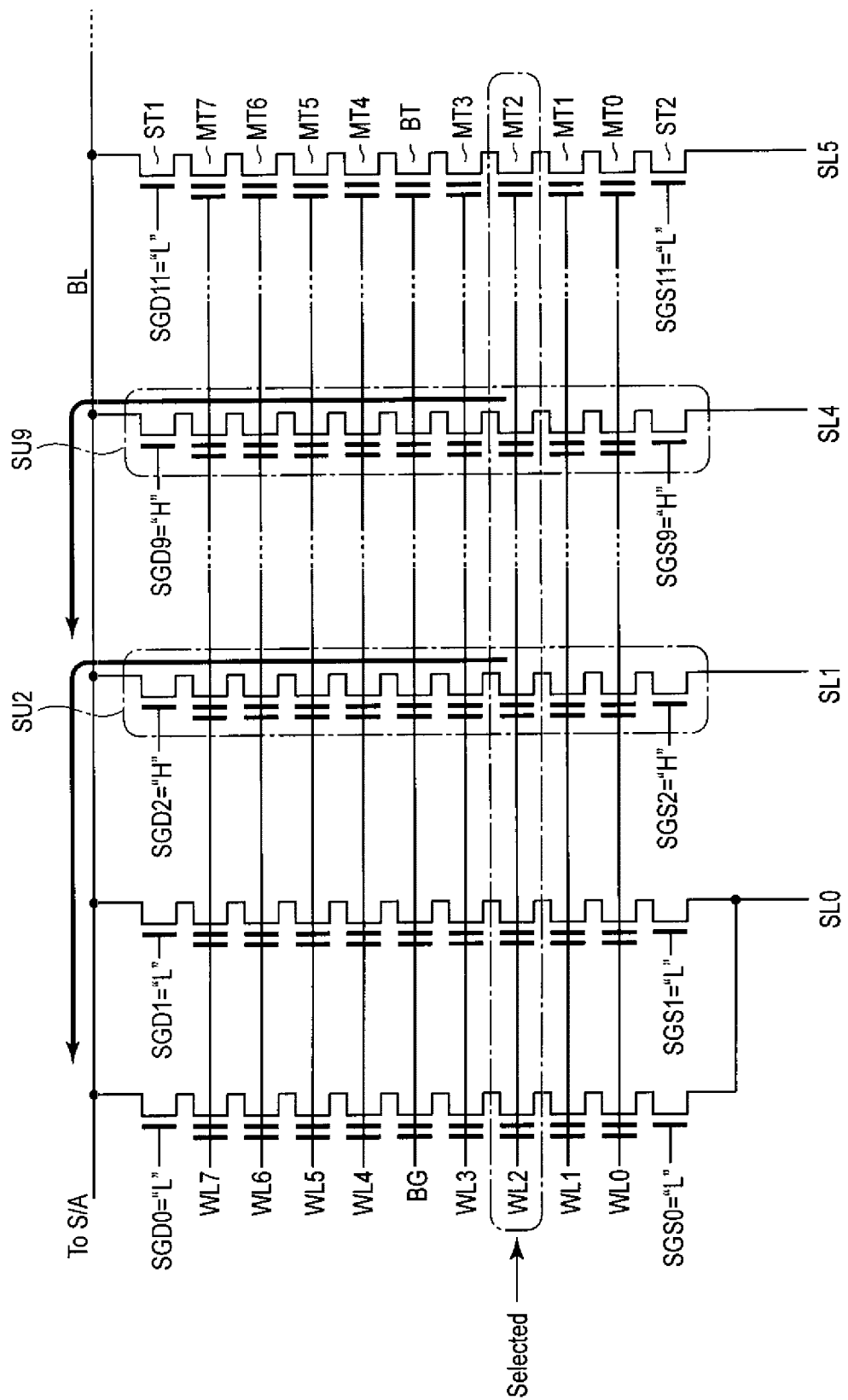
FIG. 14 is a circuit diagram of a memory cell array according to the first embodiment.

In this regard, in the case of the present embodiment, as described referring to FIGS. 5 and 6, the ROM fuse information is written in the plural string units SU (for example, SU2 and SU9). Further, in power-on reading, the ROM fuse information is read from the plural string units SU2 and SU9 at the same time. Accordingly, even though an MH opening defect is included in any one string unit SU, if the MH opening defect is not included in the other string unit, it is possible to read correct data. This is shown in FIG. 14. FIG. 14 is a circuit diagram of a memory cell array, and is particularly focused on one bit line.

As shown in FIG. 14, the select gate lines SGD2 and SGS2, and the select gate lines SGD9 and SGS9 are selected, and the ROM fuse information is read from the string units SU2 and SU9 at the same time. An arrow line in FIG. 14 shows a state where the data is read from selected cells to the sense amplifier.

For example, even though there is an MH opening defect in the string unit SU2, if there is no MH opening defect in the string unit SU9, a cell current flows to the source line SL through the current path of the string unit SU9 from the bit line.

Accordingly, even though there is an MH opening defect, it is possible to perform correct data reading. Particularly, the ROM fuse information is information necessary for operation of the NAND flash memory 100. Further, the ROM fuse information is not basically output to the outside of the NAND flash memory 100, and thus, it is not possible to perform ECC correction by the controller 200. Thus, it is highly necessary that correct writing and reading be performed in the NAND flash memory 100. In this regard, according to the present embodiment, it is possible to improve operation reliability of the memory system 1.

Further, in the present embodiment, as described referring to FIG. 9, during reading of the ROM fuse information, the sense operation and the strobe operation are executed plural times. The number of times is large compared with normal data reading other than the ROM fuse information. Thus, it is possible to reduce current consumption of the NAND flash memory 100.

More specifically, as described referring to FIG. 9, in the present embodiment, the bit line current may be driven by the plural string units SU (SU2 and SU9) for each bit line BL. Accordingly, there is a possibility that current consumption is increased compared with the normal data reading time in which the bit line current is driven by one string unit SU.

In this regard, in a method according to the present embodiment, by increasing the number of senses and strobes, the bit line BL where an electric current is very large is locked out early. The timing may be earlier than an initial lockout timing at the normal data reading time (reading other than POR), for example. Further, the lockout is sequentially performed from a bit line where an electric current is large.

Thus, by shortening the period when a large electric current flows in the bit line, it is possible to suppress increase in current consumption.

In the example in FIG. 9, the string units SU2 and SU9 are selected, but in the case of failure in POR, the string units to be selected at the same time may be changed to read the ROM fuse information again (for example, in the example in FIG. 6, string units SU4 and SU9 are simultaneously selected to read the ROM fuse). Alternatively, in the case of a configuration in which plural planes (sets of memory cell arrays and sense amplifiers) are provided, plural string units may be similarly selected in a different plane to read the ROM fuse information. In this case, the ROM fuse information may be read from the same string units (in the example in FIG. 6, the string units SU2 and SU9) as in the failed POR, or may be read from other string units. This is similarly applied to second and third embodiments to be described later.

2. Second Embodiment

Next, a semiconductor memory device, a controller, and a memory system according to a second embodiment will be described. In the present embodiment, reading is sequentially executed, compared with the first embodiment in which reading is executed in plural ROM fuse regions at the same time. Hereinafter, only different points from the first embodiment will be described.

2.1 Operation of NAND Flash Memory 100

Figure 15:
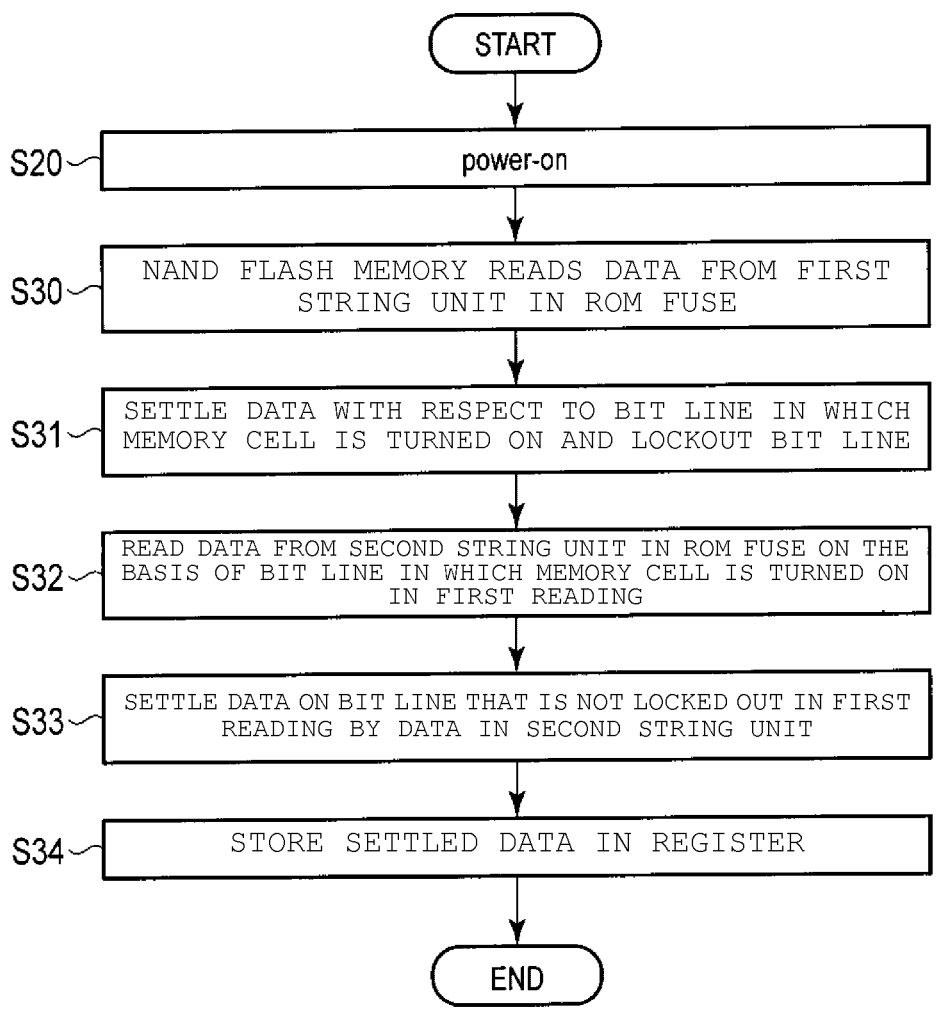
FIG. 15 is a flowchart illustrating an operation when electric power is supplied, according to a second embodiment.

An operation immediately after electric power is supplied to the NAND flash memory 100 according to the present embodiment will be described referring to FIG. 15. FIG. 15 is a flowchart illustrating an operation of the NAND flash memory 100.

As shown in FIG. 15, the NAND flash memory 100 starts up as electric power is supplied by the controller 200 (step S20). As described in the first embodiment, in the started NAND flash memory 100, a command from the controller 200 is not received, but a boot sequence is executed by the sequencer 141.

That is, the sequencer 141 reads data from the ROM fuse (POR). Here, the sequencer 141 selects any page (a first string unit) from plural pages that are ROM fuse regions, to read data (step S30). Further, the other page (a second string unit) is not selected.

Further, the sequencer 141 settles data with respect to the bit line BL where a selected cell is turned on, and locks out the bit line (step S31).

Then, the sequencer 141 performs a second reading for each bit line BL (bit line BL that is not locked out) where a cell selected in steps S30 and S31 is turned off. In the second reading, the second string unit is selected (step S32).

Further, the sequencer 141 settles data with respect to the bit line that is a target of the second reading according to the result in step S32 (step S33).

Then, the sequencer 141 stores ROM fuse information obtained in the second reading in the register 143 (step S34).

Figure 16:
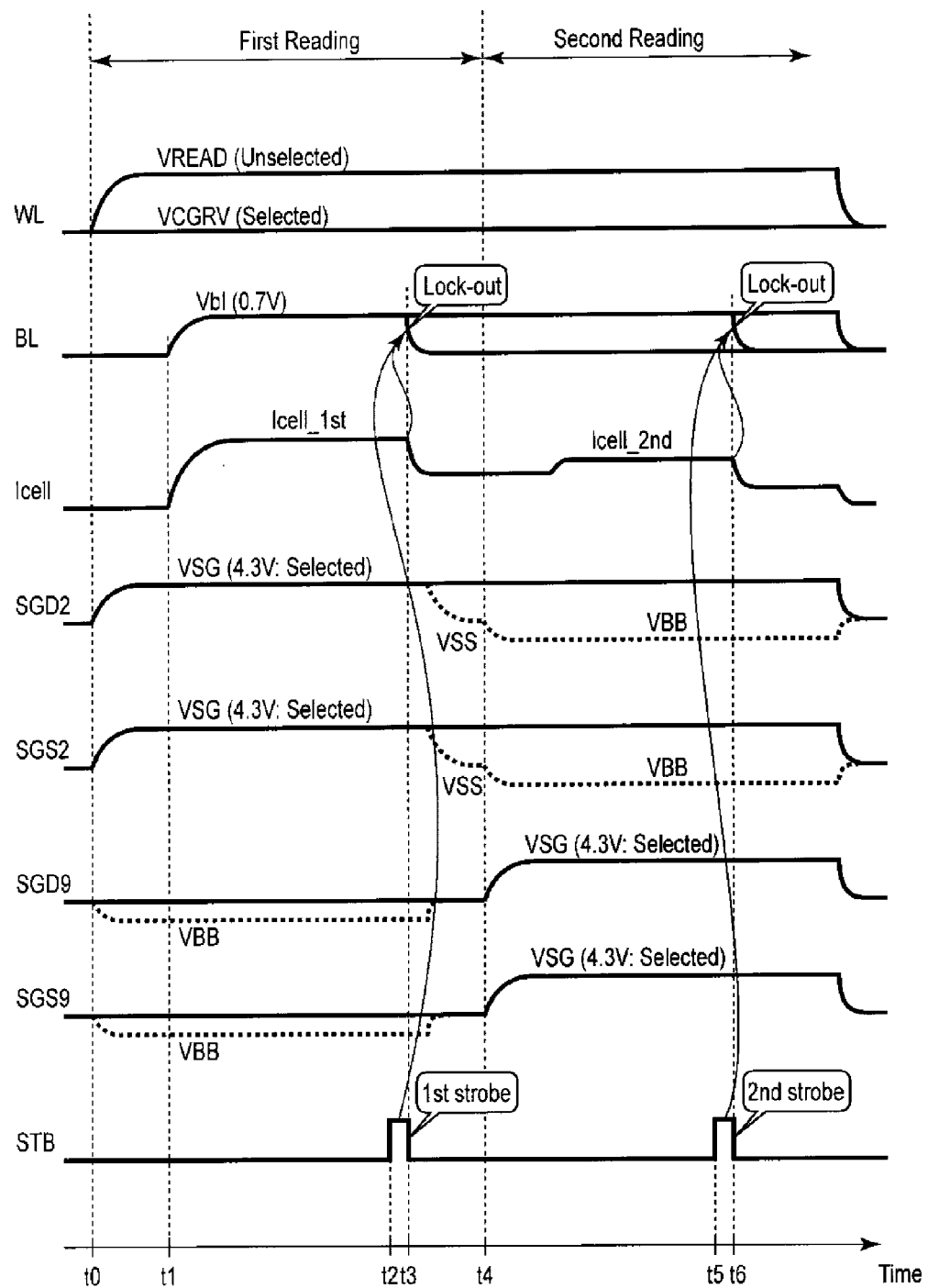
FIG. 16 is a timing chart of various signals when a reading operation is performed, according to the second embodiment.

Details about steps S30 to S32 will be described referring to FIG. 16. FIG. 16 is a timing chart of various wirings and control signals when ROM fuse information is read, which corresponds to FIG. 9 in the first embodiment. In the following description, as shown in FIGS. 5 and 6, a case where the ROM fuse information is read from the string units SU2 and SU9 will be described.

As shown in FIG. 16, first, at the time point t0, the sequencer 141 sets the select gate line SGD2 to an "H" level. The other select gate lines SGD including the select gate line SGD9 are all set to an "L" level. Further, the sequencer 141 sets the select gate line SGS2 to an "H" level at the time point t0. The other select gate lines SGS including the select gate line SGS9 are all set to an "L" level. Further, at the time point t1, the sequencer 141 starts pre-charging of the bit line. As a result, the ROM fuse information is read from the string SU2 to the bit line BL. Here, the size of a cell current Icell_1st that flows in the bit line BL depends on data retained in the memory cell transistor in the string SU2, the presence or absence of a defect, and easiness of the flow of electric current of the memory cell transistor.

If the cell current Icell_1st is sufficiently large and the transistor 17 of the sense amplifying part SA is turned on, the corresponding bit line BL is locked out (at the time point t3). With respect to the bit lines BL that are not locked out, the second reading is executed. That is, at the time point t4, the sequencer 141 sets the select gate line SGD9 to an "H" level, and sets the other select gate lines SGD to an "L" level. Further, the sequencer 141 sets the select gate line SGS9 to an "H" level, and sets the other select gate lines SGS to an "L" level. Consequently, the ROM fuse information is read from the string SU9 to the bit line BL. At this time, a cell current Icell_2nd that flows in the bit line BL depends on data retained in the memory cell transistor in the string SU9, the presence or absence of a defect, and easiness of the flow of electric current of the memory cell transistor. Further, a second strobe is executed (at the time point t5).

2.2 Effect According to the Present Embodiment

In the configuration according to the present embodiment, the reading is first performed from one page from among the plural pages that retain the same ROM fuse information, the bit line determined as "1" data is locked out, and then, the ROM fuse information is read from the other page thereof. In other words, the present embodiment is obtained by shifting a timing point when the select gate lines SGD and SGS are asserted in the first embodiment.

With such a configuration, it is possible to correctly read the ROM fuse information from any one of the plural pages. Further, according to the present configuration, it is possible to prevent the electric current from flowing in the plural NAND strings 114 at the same time, and to suppress increase in the bit line current.

In the example in FIG. 16, the select gate lines SGD2 and SGS2 are in the non-selected state in the second reading, but may be in the selected state. In this case, a switching operation of the select gate lines SGD2 and SGS2 is not necessary, and thus, it is possible to achieve a high speed operation.

3. Third Embodiment

Next, a semiconductor memory device, a controller, and a memory system according to a third embodiment will be described. In the present embodiment, ROM fuse information is stored over plural blocks, compared with the first and second embodiments. Hereinafter, only different points from the first and second embodiments will be described.

3.1 ROM Fuse

Figure 17:
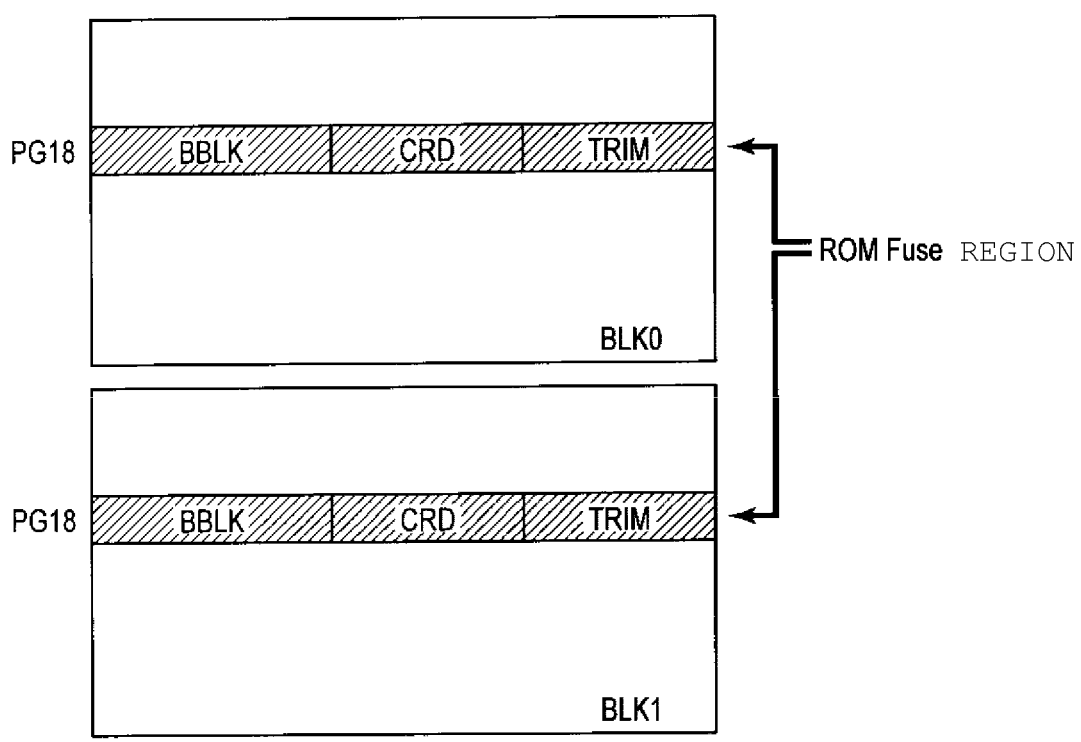
FIG. 17 is a schematic diagram of a block of memory cells according to a third embodiment.

FIG. 17 is a conceptual diagram of ROM fuse regions according to the present embodiment. As shown in FIG. 17, in this example, the blocks BLK0 and BLK1 are used as ROM fuse blocks, and the page PG18 of each of the blocks BLK0 and BLK1 is used as a ROM fuse region.

As described in the first embodiment, ROM fuse information may be written on a different page allocated to the same word line WL as in the page PG18. Alternatively, the word line WL allocated as the ROM fuse region may be different between the block BLK1 and the block BLK0.

Figure 18:
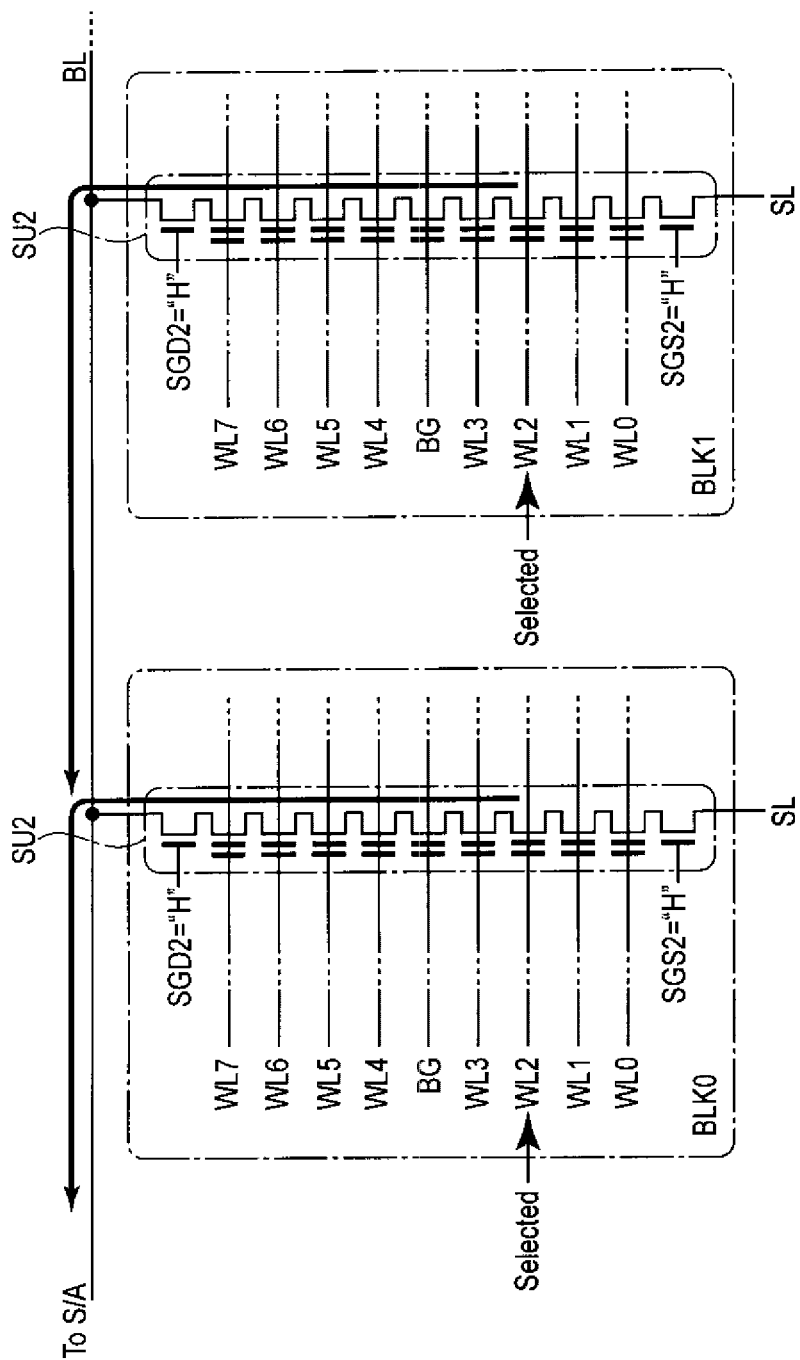
FIG. 18 is a circuit diagram of a block of memory cells according to the third embodiment.

FIG. 18 is a circuit diagram of the memory cell array 111 when ROM fuse information is read, and particularly shows only a configuration corresponding to one bit line. As shown in FIG. 18, in the present embodiment, the row decoder 112 selects select gate lines SGD2 and SGS2 of the block BLK0 and select gate lines SGD2 and SGS2 of the block BLK1 according to a command of the sequencer 141. Since the bit line BL is used in common to the blocks BLK0 and BLK1, the ROM fuse information is read from both blocks BLK0 and BLK1 to a ROM fuse on the bit line BL.

In a specific reading method, data may be read at the same time from both blocks BLK0 and BLK1, as in the first embodiment. Alternatively, as in the second embodiment, data may be read from one of the blocks BLK0 and BLK1, and then, may be read from the other.

3.2. Effect According to the Present Embodiment

The MH opening defect may have place dependence. For example, under the influence of temperature irregularity in a silicon wafer in manufacturing or warp of the wafer due to heat, the opening defect of the memory hole may concentrate in a certain region.

In this regard, in the configuration according to the present embodiment, the ROM fuse information may be written in plural blocks. That is, the plural ROM fuse regions are provided at locations that are spaced in position from each other in the memory cell array 111. Accordingly, even when the ROM fuse information of one block (for example, page PG18 of the BLK0 in FIG. 17) is not read, it is possible to increase the possibility of correctly reading the ROM fuse information of the other block (for example, page PG18 of the BLK1 in FIG. 17).

Accordingly, it is possible to further improve operation reliability of the NAND flash memory compared with the first and second embodiments.

In the present embodiment, as shown in FIG. 17, a case is described in which the ROM fuse information is written on the same page PG18 (the same word line WL2) in the blocks BLK0 and BLK1. However, the ROM fuse information may be written on different pages (different word lines).

4. Fourth Embodiment

Next, a semiconductor memory device, a controller, and a memory system according to a fourth embodiment will be described. In the first to third embodiments, the data writing and data reading method using plural pages are applied to the ROM fuse information. However, the present method may be applied to normal data as well as the ROM fuse information.

The present embodiment relates to such a case. Hereinafter, only different points from the first to third embodiments will be described.

4.1 Flag Information

FIG. 19 is a table retained by the NAND flash memory 100, in which the table retains flag information. The flag information is information indicating whether the amount of MH opening defects of each block BLK is large or small. In the example in FIG. 19, "0" represents a small amount of MH opening defects, and "1" represents a large amount of MH opening defects. In the example in FIG. 19, it can be understood that there is a large amount of MH opening defects in blocks BLK1 and BLK2.

The table is created by a tester in a test before shipping, for example. That is, the tester performs an MH opening defect test for the NAND flash memory 100. If the number of MH opening defects is equal to or larger than a predetermined value, the tester raises a flag. Further, the created table is written in any region of the memory cell array 111 of the NAND flash memory 100. The table may be written in a ROM fuse region as apart of the ROM fuse information, or may be written in a normal region other than the ROM fuse region. Here, it is preferable that access from a host to the table is prohibited and re-writing into the table is prohibited.

4.2 Operation of Memory System

Figure 20:
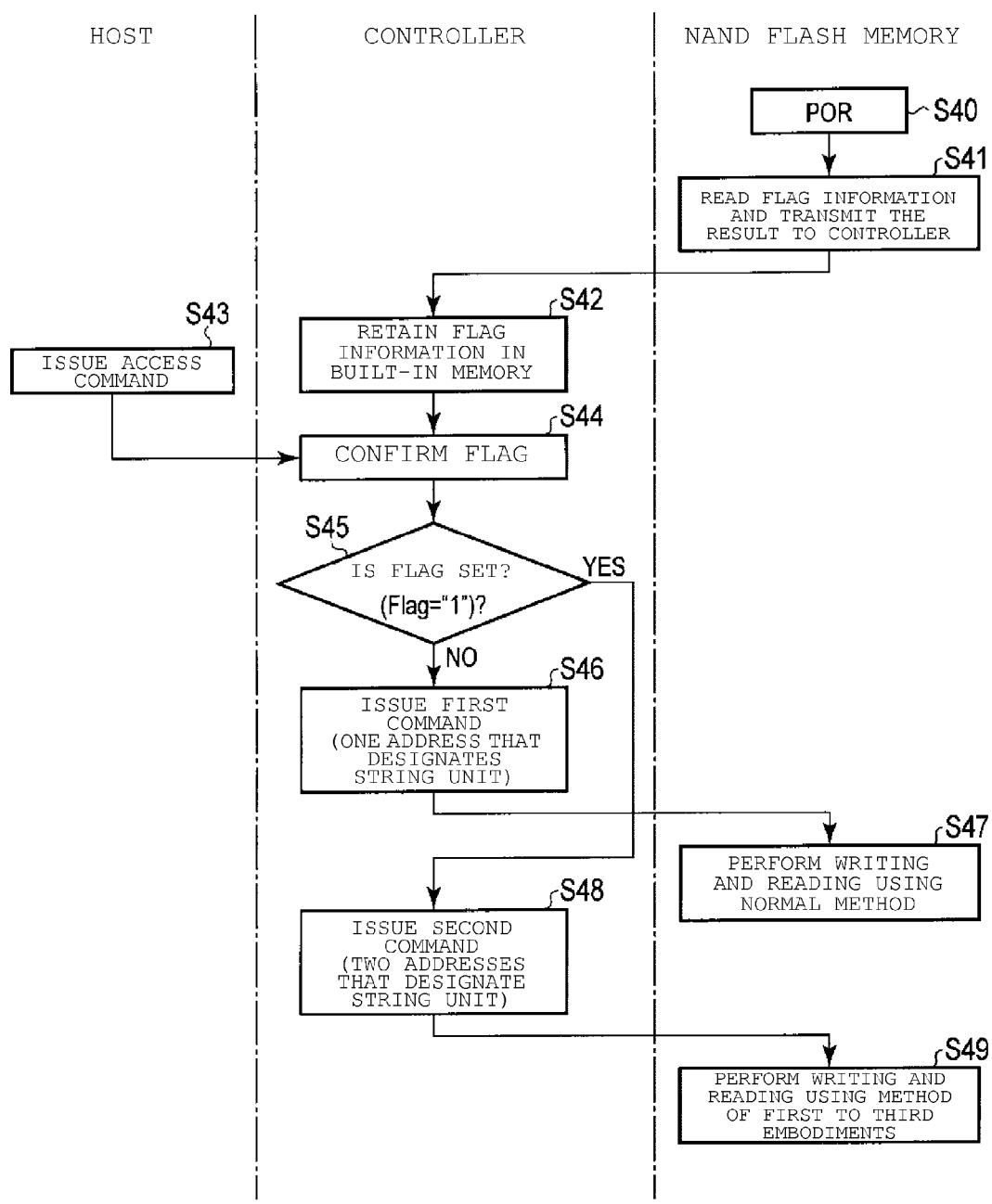
FIG. 20 is a flowchart illustrating an operation of a memory system according to the fourth embodiment.

Next, the operation of the memory system 1 according to the present embodiment will be described referring to FIG. 20. FIG. 20 is a flowchart illustrating an operation until the controller 200 accesses the NAND flash memory 100 on the basis of a requirement of the host device 300 immediately after electric power is supplied to the NAND flash memory 100.

As shown in FIG. 20, the NAND flash memory 100 performs power-on reading immediately after electric power is supplied to the NAND flash memory 100, and reads ROM fuse information from the memory cell array 111 to store the read ROM fuse information in the register 143 (step S40). Further, the NAND flash memory 100 reads flag information from the memory cell array 111, and then transmits the read flag information to the controller 200 (step S41). As described above, if the flag information is stored in the ROM fuse region, the flag information is read in step S40.

The controller 200 retains the flag information received from the NAND flash memory 100 in the built-in memory 240, for example (step S42). Further, the controller 200 manages the blocks BLK on the basis of the flag information. Then, if an access command (write access or read access) is received from the host device 300 (step S43), the CPU 230 of the controller 200 confirms the flag information in the built-in memory 220 (step S44). That is, the CPU 230 confirms whether a flag is raised in the block BLK to be accessed.

If the flag is not raised, that is, if the block has a small amount of MH opening defects (No in step S45), the CPU 230 issues a first command (step S46). The first command is a normal write and read command, and the address issued for designating the string unit SU is only one.

If the flag is raised, that is, if the block has a large amount of MH opening defects (Yes in step S45), the CPU 230 issues a second command (step S48). The second command is a command for executing the reading or writing as described in the first to third embodiments, and two addresses that designate the string unit SU are issued.

The NAND flash memory 100 that receives the first command executes normal writing or reading according to commands of the sequencer 141 (step S47). That is, according to the address received from the controller 200, writing or reading in the unit of pages is executed in any one string unit SU.

On the other hand, the NAND flash memory 100 that receives the second command executes the writing or reading described in the first to third embodiments according to commands of the sequencer 141 (step S49). That is, with respect to two string units SU designated by two addresses received from the controller 200, writing or reading in the unit of pages is executed. In the case of the writing operation, the same data is programmed with respect to two pages of different string units SU, and verification is executed for the two pages. The programming and verification may be performed over two pages at the same time. In this case, as described in the first embodiment, two select gate lines SGD are simultaneously selected. Alternatively, the programming and verification for the two pages may be performed for each page at different times. In this case, as described in the second embodiment, two select gate lines SGD (and SGS) are sequentially selected. As described in the third embodiment, two pages in which the same data is written may be in different blocks BLK.

4.3 Effect According to the Present Embodiment

As described above, the first to third embodiments may be applied to the normal data writing and reading.

In this case, the controller 200 manages the blocks BLK on the basis of the flag information. Here, the flag information to be used is not limited to information shown in the table in FIG. 19, and may be a block address or the like of the block BLK having a large amount of MH opening defects, for example. If the information is information capable of designating the block BLK having a large amount of MH opening defects, there is no limit.

Further, when data is written in the block BLK having a large amount of MH opening defects, the controller 200 writes the same data on two pages. Accordingly, the controller 200 manages the block BLK having a large amount of MH opening defects as a block having a half of the capacity of the block BLK having a small amount of MH opening defects.

Generally, if the number of MH opening defects included in a certain block BLK is a predetermined number or more, the block BLK is registered as a bad block. However, in the present embodiment, although the capacity becomes half by retaining the same data on two pages, the block BLK may be treated as a usable block without being registered as the bad block.

In the present embodiment, an example is shown in which if the controller 200 issues two types of commands and issues the second command (step S48), the controller 200 issues two addresses for designating two pages. As the example in which two address are issued, in the case of the memory cell array shown in FIG. 3, for example, the controller 200 recognizes the number of valid pages of one block BLK as four pages, and manages word lines WL0 to WL3 and word lines WL4 to WL7 as each set. Further, when the controller 200 writes data on a word line WLi (i is a natural number of 0 to 3), the controller 200 issues an address corresponding to the word line WLi and an address corresponding to a word line WL(i+4). That is, in accessing the word line WL0, accessing the word line WL4 is performed at the same time.

Figure 21:
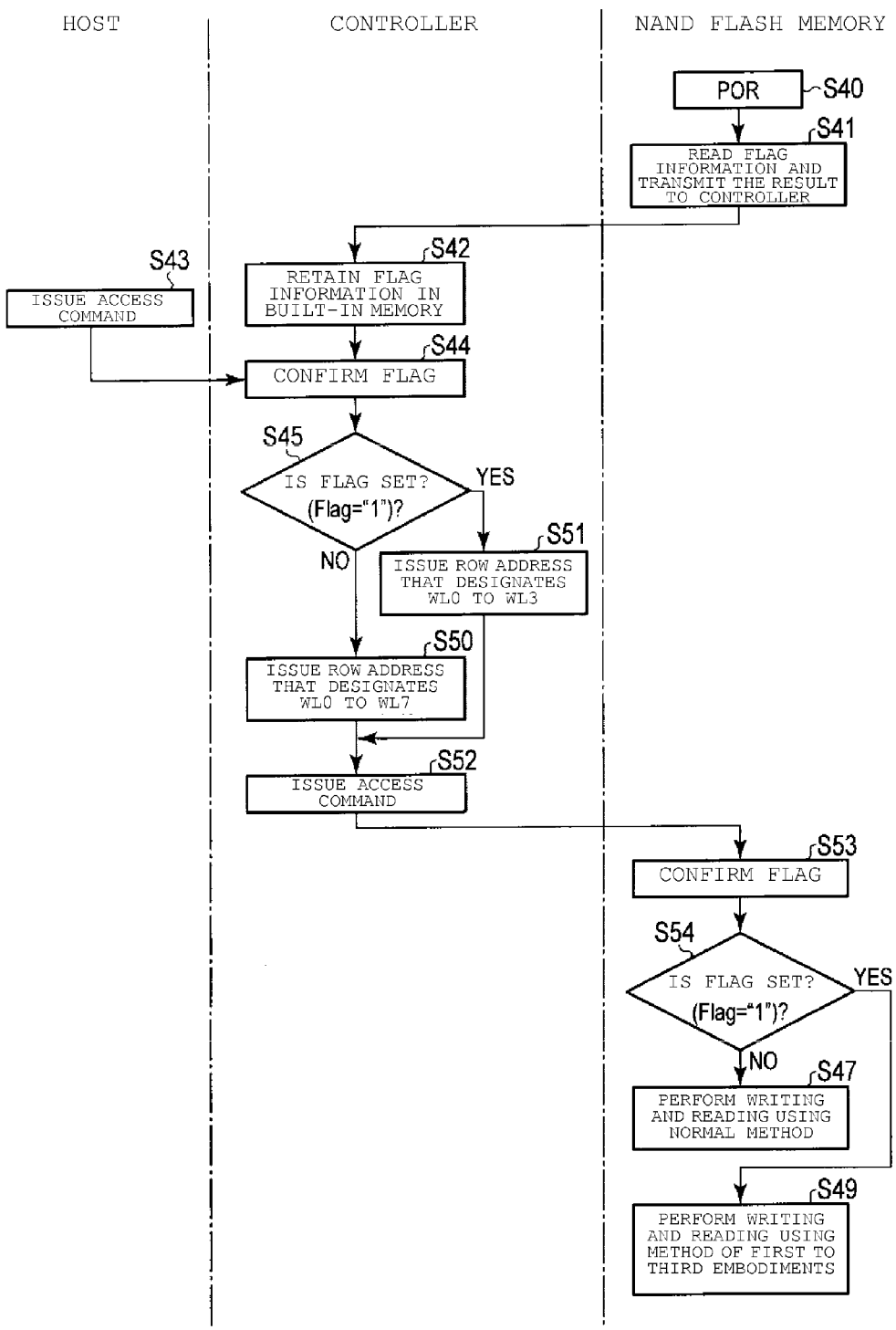
FIG. 21 is a flowchart illustrating an operation of a memory system according to a modification example of the fourth embodiment.

As another method, one type of command and address may be issued by the controller 200. This example is shown in FIG. 21. FIG. 21 is a flowchart illustrating operations of the NAND flash memory 100 and the controller 200.

As shown in FIG. 21, if the flag is not raised after step S44 (No in step S45), that is, if an access target block is a block having a small amount of MH opening defect, the controller 200 issues an address corresponding to any one of the word lines WL0 to WL7 (step S50). On the other hand, if the flag is raised (Yes in step S45), that is, if an access target block is a block having a large amount of MH opening defect, the controller 200 issues an address corresponding to any one of the word lines WL0 to WL3 (step S51). In this case, an address corresponding to the word lines WL4 to WL7 is not issued. Further, the controller 200 issues a write command or a read command to the NAND flash memory 100 in addition to the address issued in step S50 or S51 (step S52).

The NAND flash memory 100 that receives the command confirms flag information retained in the register 143 (step S53). Further, if the received address corresponds to the block having a small amount of MH opening defects (No in step S54), the normal writing is performed (step S47). That is, the sequencer 141 of the NAND flash memory 100 writes data on a page corresponding to the received address, or reads the data from the page.

On the other hand, if the received address corresponds to the block having a large amount of MH opening defects (Yes in step S54), the sequencer 141 executes writing or reading with respect to a page corresponding to the word line WLi corresponding to the received address and a page corresponding to the word line WL (i+3) (step S49). Here, for example, the sequencer 141 may issue a page address corresponding to the word line WL (i+3).

According to the present method, it is possible to reduce the load of the controller 200 compared with the case in FIG. 20. As a control method, the method described in either FIG. 20 or FIG. 21 may be appropriately selected.

Further, in FIG. 19, the state of MH opening defects is recorded in the unit of blocks. However, the state may be recorded in the unit of strings other than in the unit of blocks. Further, the present embodiment may be performed in the unit of strings other than in the unit of blocks. That is, the controller may detect a string unit having a large amount of MH opening defects using flag information, and may access the NAND flash memory on the basis of the information. A string unit address may be retained instead of the flag.

This is because the MH opening defect affects the entire of the corresponding string unit, but does not badly affect other string units. This is similarly applied to a fifth embodiment to be described later.

5. Fifth Embodiment

Next, a semiconductor memory device, a controller, and a memory system according to a fifth embodiment will be described. The present embodiment is performed by using the method described in the first to third embodiments, when the controller accesses, particularly, management data in the fourth embodiment. Hereinafter, only different points from the first to fourth embodiments will be described.

5.1 Operation of Controller

Figure 22:
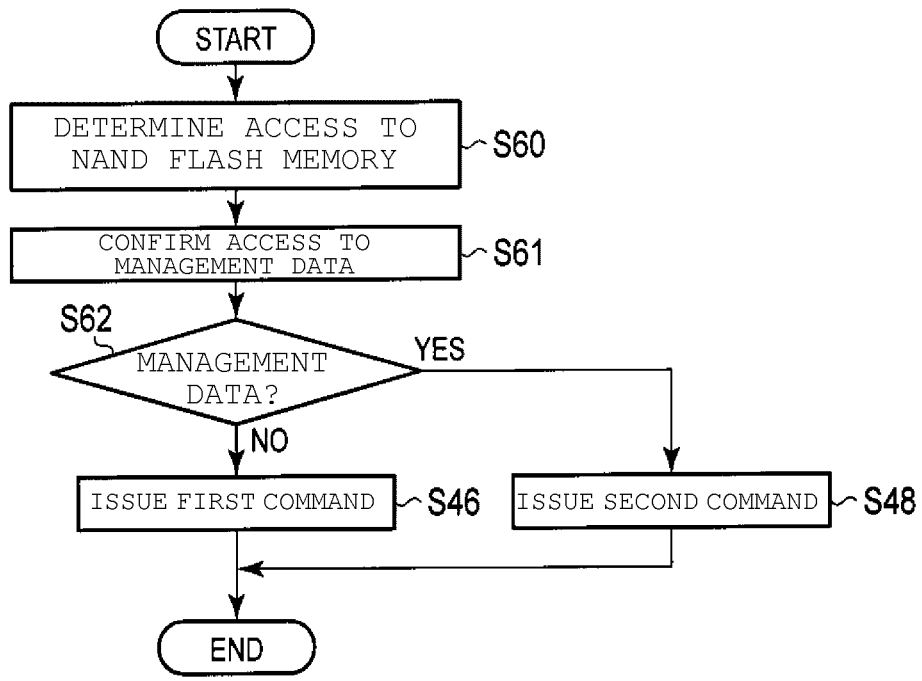
FIG. 22 is a flowchart illustrating an operation of a controller according to a fifth embodiment.

FIG. 22 is a flowchart illustrating an operation of the controller 200 according to the present embodiment.

As shown in FIG. 22, if the controller 200 determines to perform access to the NAND flash memory 100 (for example, when access from the host device 300 is present, or in updating of internal data regardless of the access from the host device 300) (step S60), the controller 200 confirms whether the access is access to management data (step S61). The management data is data other than user data received from the host device, and may correspond to FAT data of a file allocation table (FAT) file system, directory entry information, or the like.

If the data is not the management data (No in step S62), the controller 200 issues the first command described in the fourth embodiment (step S46). That is, the controller 200 writes the management data on a certain page, or reads the management data from a certain page.

On the other hand, if the data is the management data (Yes in step S62), the controller 200 issues the second command described in the fourth embodiment (step S48). That is, the controller 200 writes the same management data on two pages, or reads the same management data from two pages.

5.2 Effect According to the Present Embodiment

According to the present embodiment, it is possible to improve operation reliability of the NAND flash memory.

The FAT data in the FAT file system or the directory entry information is important data in a memory system, and thus, if the information is lost, it is difficult to access the NAND flash memory 100.

In this regard, according to the present embodiment, by writing data on two pages, it is possible to prevent the important data from being lost.

6. Modification Examples and Others

As described above, the semiconductor memory device 100 according to the embodiments includes the memory cell array (111 in FIG. 2) that is capable of storing data in a nonvolatile manner and the controller (141 in FIG. 2) that controls data access to the memory cell array. The memory cell array retains the same data on the plural pages (PG18 and PG74 in FIGS. 5 and 6). The controller executes a reading operation for the plural pages (PG18 and PG74) where the same data is retained, to settle the read data (Step S21 in FIG. 8 and timing points t4 to t7 in FIG. 9).

With such a configuration, it is possible to improve operation reliability of the semiconductor memory device. The embodiments are not limited to the above-described embodiments, and various modifications may be made.

6.1 First Modification Example

A method of reading the ROM fuse information described in the first to third embodiments may be performed in failure of the normal POR. Such an example is shown in FIG. 23.

First, as described in FIG. 6, the same ROM fuse information is written on the plural pages PG18 and PG74 allocated to the same word line WL (WL2). Since the ROM fuse information is important data, 1-bit data is complementarily stored in two memory cell transistors. That is, if the ROM fuse information with respect to a certain bit line BL0 is "1", complementary data "0" is written in a different bit line BL1.

Further, by reading both of the data, it is possible to improve the accuracy of the ROM fuse information.

Figure 23:
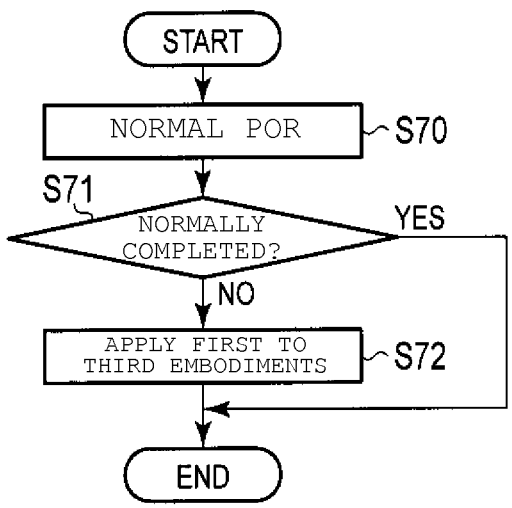
FIG. 23 is a flowchart illustrating a reading operation according to a modification example of the first to third embodiments.

Further, as shown in FIG. 23, immediately after electric power is supplied to the NAND flash memory 100, the NAND flash memory 100 executes power-on reading (step S70). In step S70, normal power-on reading is executed. That is, the ROM fuse information is read only from any one page, not from plural pages.

Further, the sequencer 141 confirms whether the power-on reading in step S70 is normally completed. If the process is normally completed (Yes in step S71), the power-on reading process is terminated, and the NAND flash memory 100 enters a normally operable state.

On the other hand, if the power-one-reading is not normally completed (No in step S71), the sequencer 141 executes the power-on reading again using the method described in the first to third embodiments (step S72). That is, the sequencer 141 reads the same ROM fuse information from the plural pages.

The above-described method may be used. Further, the process shown in FIG. 23 may be executed whenever electric power is supplied after shipping, for example, or may be executed in a test before shipping. Further, in the latter case, setting may be performed so that if the process is not normally completed in step S71, the power-on reading described in the first to third embodiments is constantly performed when electric power is supplied after shipping.

Further, the first to third embodiments are not only applied to the ROM fuse information, but also may be applied to data that is hidden in the NAND flash memory 100 and is not read by the controller 200. This is because the controller 200 cannot perform the ECC correction for such data.

6.2 Second Modification Example

Further, in the first to third embodiments, an example in which two string units (string units SU2 and SU9 in the example in FIGS. 5 and 6) are used as the ROM fuse regions is described. However, three or more string units may be used. That is, the same ROM fuse information may be written on three or more pages, and the data may be read from three or more pages in the power-on reading process.

This is similarly applied to the fourth and fifth embodiments, and thus, if a flag is raised, or if access to management data is performed, the same data may be written on three or more pages, and data may be read from three or more pages.

6.3 Third Modification Example

Figure 24:
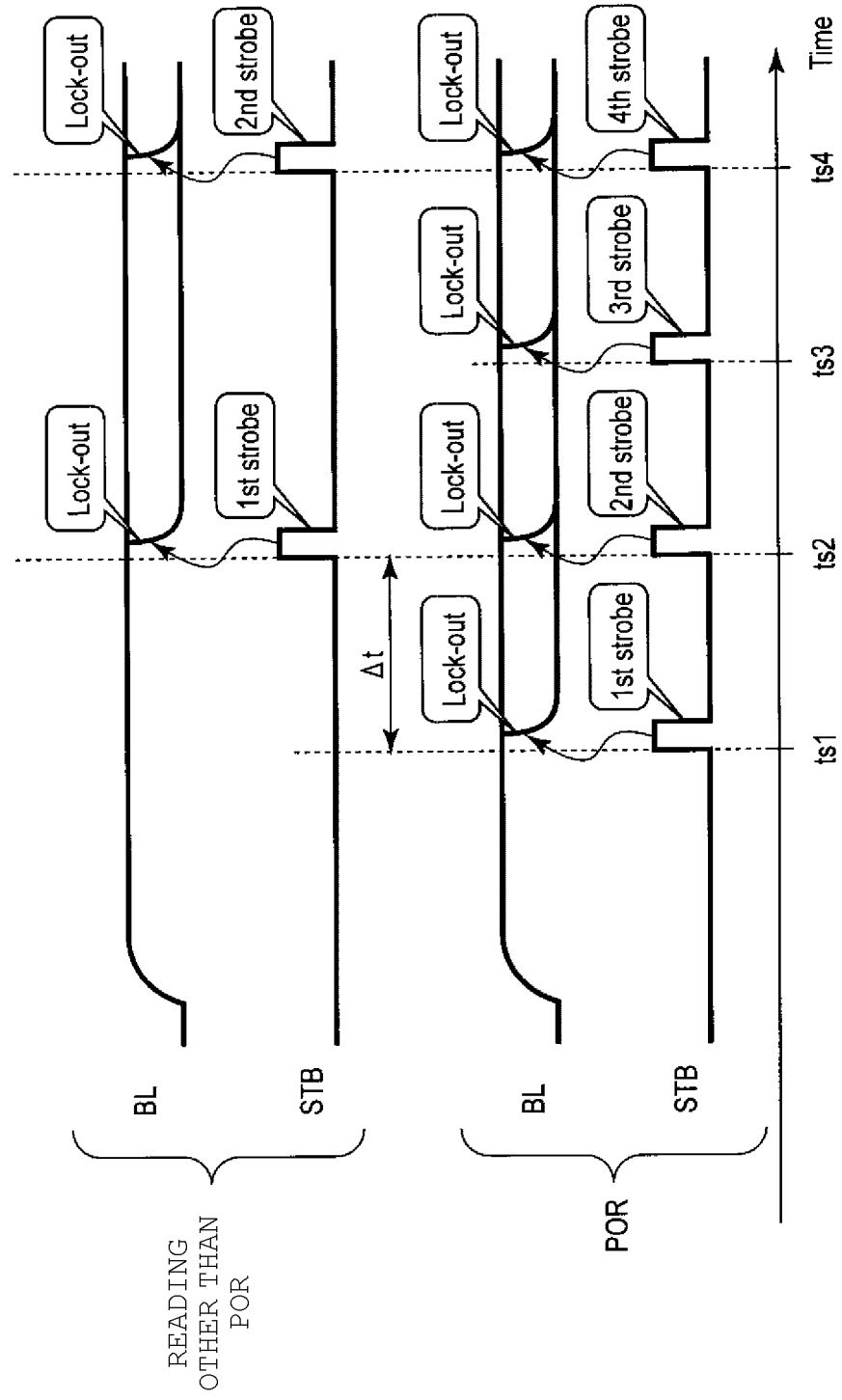
FIG. 24 is a flowchart illustrating an operation when a reading operation is performed, according to the first embodiment.

Further, in the first embodiment described referring to FIG. 9, a case where four strobe operations are executed for each reading operation is described as an example. However, the number of strobes may be five or more. Further, in the first embodiment, an initial strobe timing in power-on reading may be performed earlier than a strobe timing in a normal reading operation other than the power-on reading. This state is shown in FIG. 24. FIG. 24 is a timing chart of a bit line voltage, a cell current, and a control signal STB in the power-on reading and reading other than the power-on reading.

As shown in FIG. 24, the strobe operation is performed plural times even in the normal reading (two times in the example in FIG. 23). However, the number of strobes is smaller than the number of strobes in the power-on reading. Further, a time point ts1 of the initial strobe timing in the power-on reading is performed at a timing earlier than a time point ts2 of the initial strobe timing in the normal reading. In the example in FIG. 24, the second and fourth strobe timings in the power-on reading match with the first and second strobe timings in the normal reading, but should not necessarily match therewith.

This is similarly applied to the third embodiment. Further, it is also similarly applied to the fourth and fifth embodiments. That is, in the fourth and fifth embodiments, if the flag is raised, or if the management data is read, the initial strobe timing is performed earlier than other cases.

Here, even though the data is simultaneously read from plural string units, if a cell current falls to a predetermined value or less, it is not necessary to quicken the initial strobe timing in the power-on reading.

6.4 Fourth Modification Example

Further, in the third embodiment described referring to FIG. 16, the number of strobes is one in the first reading and the second reading. However, the number of strobes in each reading may be two or more.

6.5 Fifth Modification Example

Further, the respective embodiments may be combinedly executed, or may be independently executed. For example, the fourth and fifth embodiments may be combined with the first to third embodiments, or may be independently executed.

Figure 25:
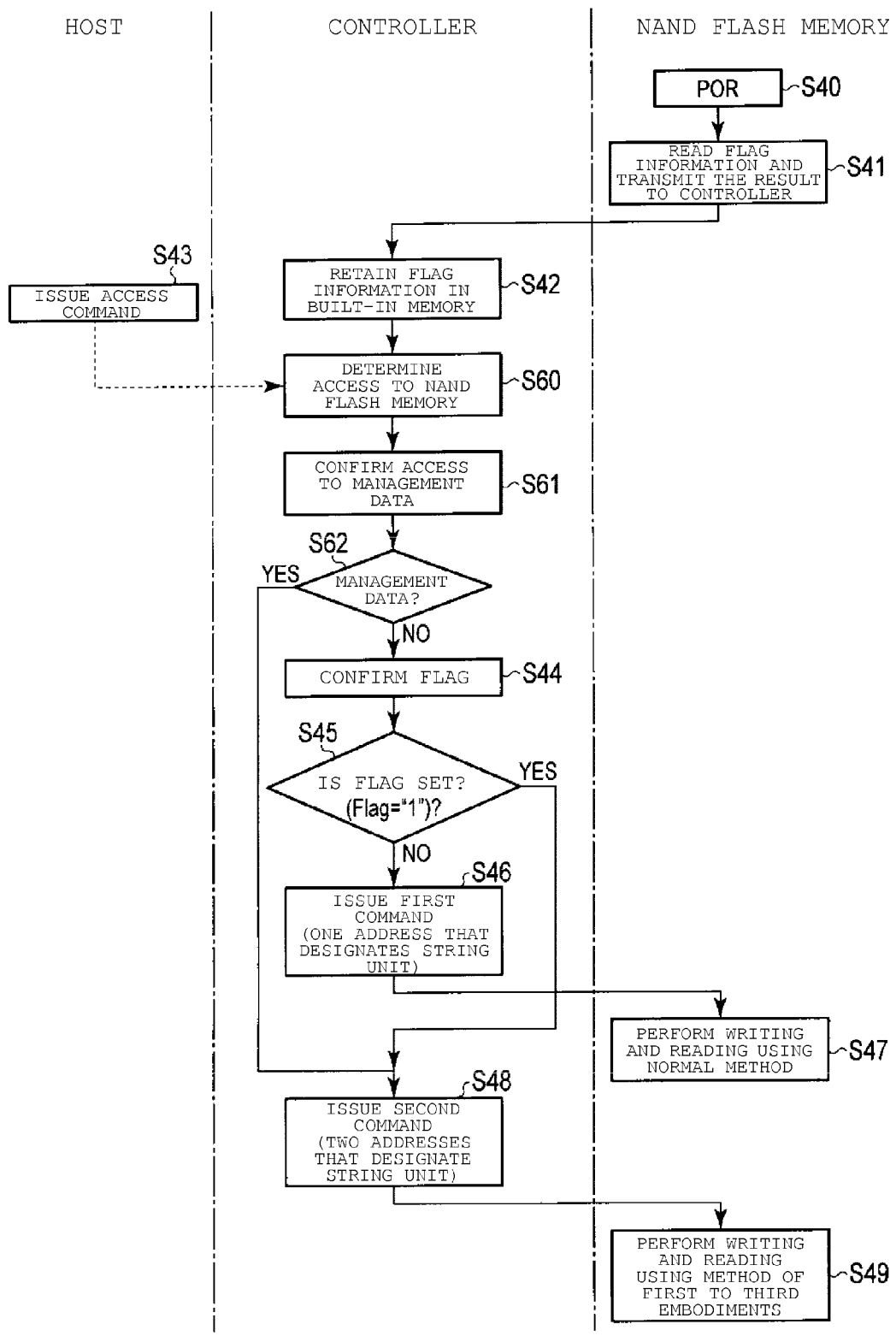
FIG. 25 is a flowchart illustrating an operation of a controller according to modification examples of the fourth and fifth embodiments.

Further, the fourth and fifth embodiments may be combined. An operation of the memory system in this case is shown in a flowchart of FIG. 25. As shown in FIG. 25, in the case of access to the management data (Yes in step S62), the same data is written into the plural string units regardless of flag information, or the same data is read from the plural string units. If the access target is not the management data (No in step S62), a command issued according to the flag information is switched (step S45).

6.6 Sixth Modification Example

Further, in the above-described embodiment, the sense amplifier that senses electric current is described as an example. However, a sense amplifier that senses voltage may be used. In the sense amplifier having such a voltage sensing method, a sense operation is performed by shielding adjacent bit lines. That is, in the voltage sensing method, voltage variation of bit lines is sensed. Here, if one bit line is discharged, a bit line adjacent thereto is affected by the electric potential variation of the discharged bit line by coupling. Consequently, a data reading error may occur. Accordingly, in the voltage sensing method, data is read for each even-bit line and odd-bit line. Further, when data is read from even-bit lines, odd-bit lines are fixed (shielded) to a constant electric potential, and when data is read from odd-bit lines, even-bit lines are fixed to a constant electric potential.

Figure 26:
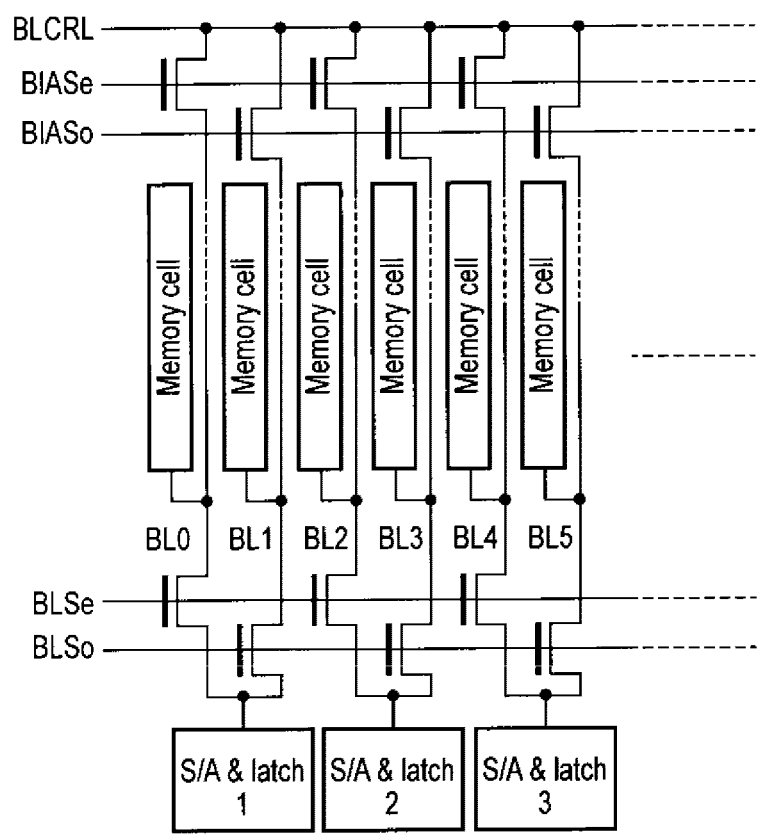
FIG. 26 is a block diagram of a semiconductor memory device according to modification examples of the first to fifth embodiments.

In a method of shielding the adjacent bit lines (hereinafter, referred to as a "bit line shielding method"), as shown in FIG. 26, one sense amplifier circuit (S/A & latch) is shared by two bit lines. That is, a configuration in which the adjacent bit lines are classified into even numbers (EVEN) and odd numbers (ODD) and the bit lines of the adjacent even number and odd number share one sense amplifier may be used.

During the reading operation of the bit line shielding method, when data on even bit lines is read (when even pages are read), transfer gates for even-bit lines (BLSe) are turned on to connect the even-bit lines to the sense amplifier. At this time, by turning on ground transistors (BIASo), the odd-bit lines are connected to BLCRL to become a ground electric potential (VSS). In this state, if the sense amplifier (S/A) pre-charges the even-bit lines, the electric potential of the odd-bit lines maintains VSS as it is, and thus, the pre-charging is appropriately performed for the even-bit lines without being affected by the odd-bit lines. The pre-charge electric potential is determined by a gate voltage called a signal BLCLAMP, and is 0.7 V, for example.

On the other hand, if data on the odd-bit lines is read, transfer gates for odd-bit lines (BLSo) are turned on to connect the odd-bit lines to the sense amplifier. Here, by turning on ground transistors (BIASe), the even-bit lines are connected to BLCRL to become the ground electric potential (VSS). In this state, if the sense amplifier (S/A) pre-charges the odd-bit lines, since the electric potential of the even-bit lines maintains VSS as it is, and thus, the pre-charging is appropriately performed for the odd-bit lines without being affected by the even-bit lines. The pre-charge electric potential is a voltage clamped by the signal BLCLAMP in a similar way to the time when the even-bit lines are pre-charged.

As described above, in the bit line shielding method, by setting adjacent non-selected bit lines during the reading operation to the ground state, it is possible to perform an accurate reading operation without being affected by signals of adjacent bit-lines.

Figure 27:
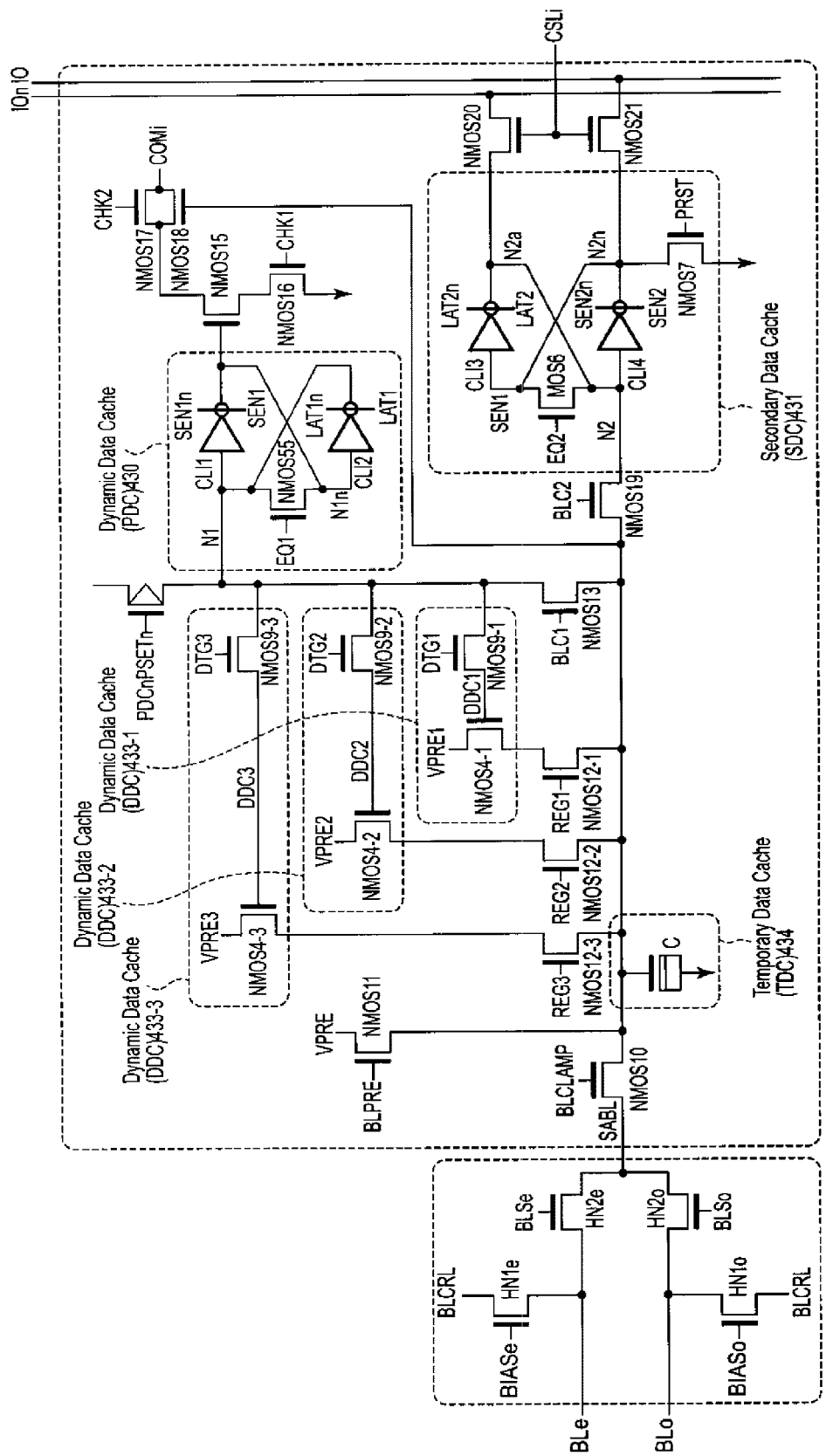
FIG. 27 is a circuit diagram of a sense amplifier according to modification examples of the first to fifth embodiments.

FIG. 27 is a circuit diagram of a sense amplifier circuit (S/A & latch) corresponding to one set of bit lines BLeO and BLo0 shown in FIG. 26.

As shown in FIG. 27, the sense amplifier circuit includes a primary data cache (PDC) 430, a secondary data cache (SDC) 431, three dynamic data caches (DDC) 433 (433-1 to 433-3), and a temporary data cache (TDC) 434. The dynamic data caches 433 and the temporary data cache 434 may be provided as necessary. Further, the dynamic data caches 433 may be used as caches that retain data for writing a mid potential (VQPW) between VDD (high potential) and VSS (low potential) into bit lines in programming.

The primary data cache 430 includes an N-channel transistor NMOS5 in parallel with clocked inverters CLI1 and CLI2. The secondary data cache 431 includes N-channel transistors NMOS6 and NMOS7 in parallel with clocked inverters CLI3 and CLI4. The dynamic data cache 433 includes N-channel transistors NMOS4 and NMOS9. Further, the temporary data cache 434 has capacity C1. Circuit configurations of the primary data cache 430, the secondary data cache 431, the dynamic data cache 433 and the temporary data cache 434 are not limited to FIG. 27, and different circuit configurations may be employed.

Further, in the example in FIG. 27, an n-channel MOS transistor is used as a transistor that controls data input and output in the data cache, but a p-channel MOS transistor may be used.

Further, the sense amplifier is connected to corresponding even-bit line BLe and the odd-bit line BLo, respectively, through n-channel MOS transistors HN2e and HN2o. The signals BLSe and BLSo are input to gates of the transistors HN2e and HN2o, respectively. Further, sources of n-channel MOS transistors HN1e and HN1o are connected to the even-bit line BLe and the odd-bit line BLo. The signals BIASe and BIASo are input to gates of the transistors HN1e and HN1o, and the signal BLCRL is input to drains thereof.

Figure 28:
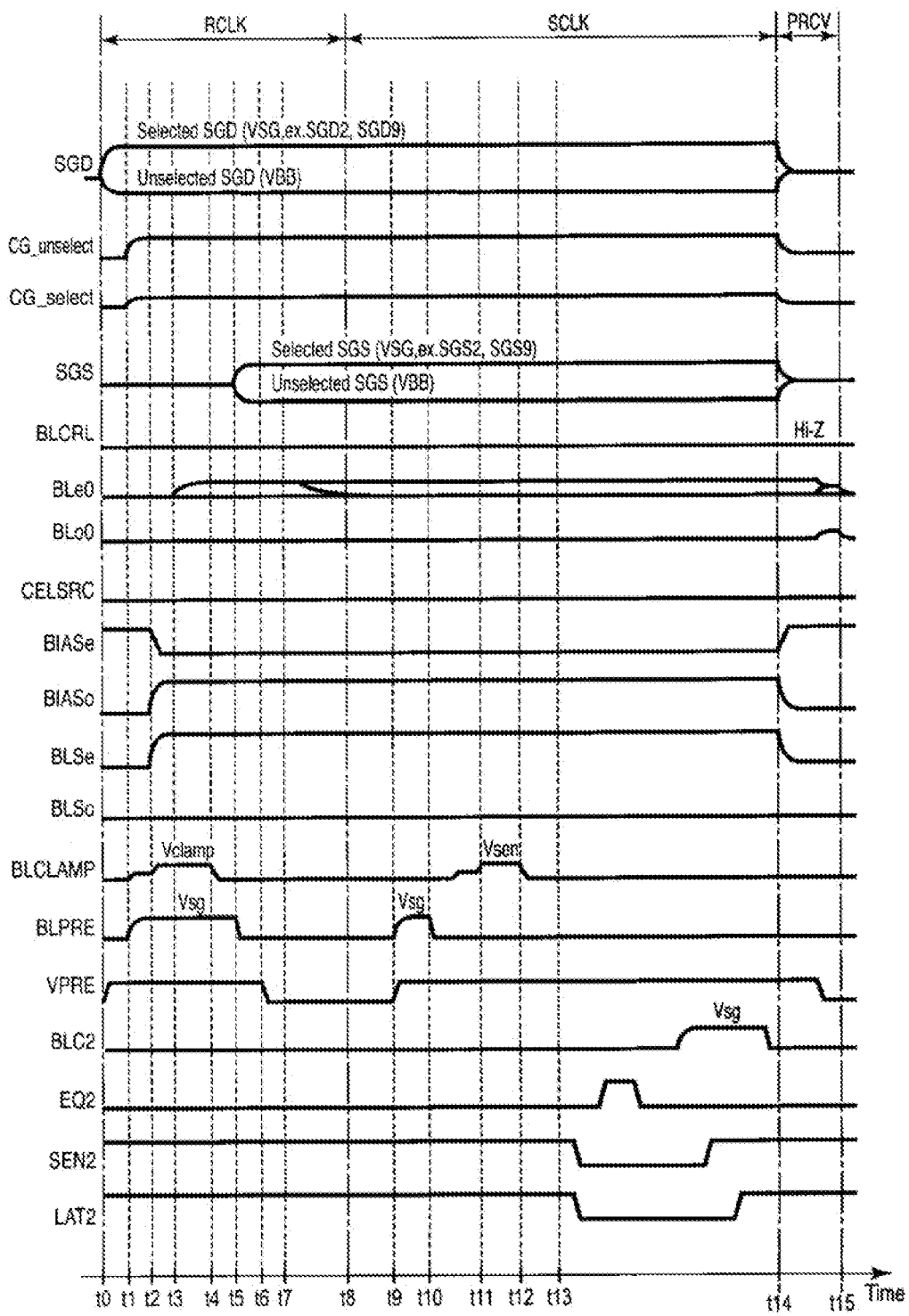
FIG. 28 is a timing chart illustrating an operation of a sense amplifier according to modification examples of the first to fifth embodiments.

FIG. 28 is a timing chart of various signals during data reading according to the sense amplifier in the present modification example. Each signal is given by the sequencer 141 described in FIG. 2, for example.

As shown in FIG. 28, at the time point to, first, a select gate line (SGD) of a selected string unit of a selected block is set to a "High" level. Further, in the sense amplifier, a pre-charge power potential VPRE is set to VDD. In the example in FIG. 28, the two select gate lines SGD2 and SGD9 are simultaneously selected. A non-selection voltage VBB (for example, negative voltage) is applied to the other non-selected select gate lines SGD other than the select gate lines SGD2 and SGD9.

Subsequently, at the time point t1, setup of word lines WL is performed in the core unit. That is, the row decoder 112 applies the voltage VCGRV to a selected word line, and applies the voltage VREAD to a non-selected word line. The voltage VCGRV is a value based on read target data, and if a memory cell transistor retains 1-bit data, for example, VCGRV=0 V. The voltage VREAD is a voltage through which a memory cell transistor is turned on regardless of retained data.

Further, the sense amplifier pre-charges the bit line (even-bit line BLe in the example in FIG. 28) as a reading target in advance. Specifically, a signal BLPRE is set to a "High" level and a transistor NMOS11 is turned on, and thus, the temporary data cache (TDC) 434 is pre-charged with the voltage VDD.

Next, at the time points t2 to t3, setting of the bit line selection signals BLSe and BLSo and the bias selection signals BIASe and BIASo is performed. In the example in FIG. 28, since the even-bit line BLe is selected, the even-bit line selection signal BLSe is set to a "High" level, and since the odd-bit line BLo is fixed to BLCTRL (=Vss), the signal BIASo is set to a "High" level.

Further, a clamp voltage for bit line pre-charging is applied to the signal BLCLAMP, and thus, the even-bit line BLe is pre-charged with 0.7 V, for example.

As described above, in the core part, the even-bit line BLe is charged with 0.7 V, and the odd-bit line BLo is fixed to Vss.

Then, at the time point t4, the signal BLCLAMP is set to 0 V, and the bit line BLe enters an electrically floating state.

Then, at the time point t5, Vsg is applied to the select gate line SGS of a source side of a selected string unit. In the example in FIG. 28, the two select gate lines SGS2 and SGS9 are simultaneously selected. A non-selection voltage VBB (for example, negative voltage) is applied to the non-selected select gate lines SGS other than the select gate lines SGS2 and SGS9. Thus, if a threshold value of a memory cell is higher than a reading voltage of a selected word line, the bit line is not discharged, and if lower, a reading current flows and the bit line is thus discharged.

Next, at time points t9 to t10, in a state where a signal VPRE becomes Vss, a signal BLPRE is set to Vsg, and thus, the temporary data cache TDC is pre-charged with VDD.

Subsequently, at time points tib to t12, a sense voltage Vsen is applied to the signal BLCLAMP. Here, if an electric potential of the selected bit line BLe is higher than Vsen-Vt, a transistor NMOS10 (transistor of BLCLAMP) is cut off as it is, and VDD is retained in a node TDC. On the other hand, if the electric potential of the selected bit line BLe is lower than Vsen-Vt, the transistor VMOS10 is turned on, and thus, the node TDC is discharged to be approximately the same as the electric potential (for example, 0.4 V) of the bit line BLe.

Then, at time points t13 to t14, sensed data is input to the secondary data cache SDC. Specifically, signals SEN2 and LAT2 are once turned off, and a signal EQ2 is set to VDD, and thus, node SEN1 and node N2 have the same electric potential. Then, a signal BLC2 becomes BLC2=VDD+Vth, and TDC data is transmitted to SDC. Consequently, if the original node TDC is "High", SDC data becomes "1". Further, if the node TDC is "Low" (for example, 0.4 V), the SDC data becomes "0".

As described above, data is read from the even-bit line BLe. Then, at time point t14 to t15, a recovery operation is performed, and thus, the respective nodes and signals are reset.

This is similarly applied to reading of the odd-bit line BLo. In this case, differently from the case in FIG. 28, the signal BLSo is "High", and the signal BLSe is "Low". Further, the signal BIASe is "High", and the signal BIASo is "Low".

As described above, the first to fifth embodiments may be applied to the semiconductor memory device that includes the sense amplifier using the voltage sensing method. In the electric current sensing method, it is possible to read data from all bit lines in a lump. On the other hand, in the voltage sensing method, data is respectively read from even-bit lines and odd-bit lines. That is, two pages of a page corresponding to even-bit lines and a page corresponding to odd-bit lines are allocated for each word line in individual string units. Further, in this case, the size of one page becomes half the size of one page in the electric current sensing method.

Figure 29:
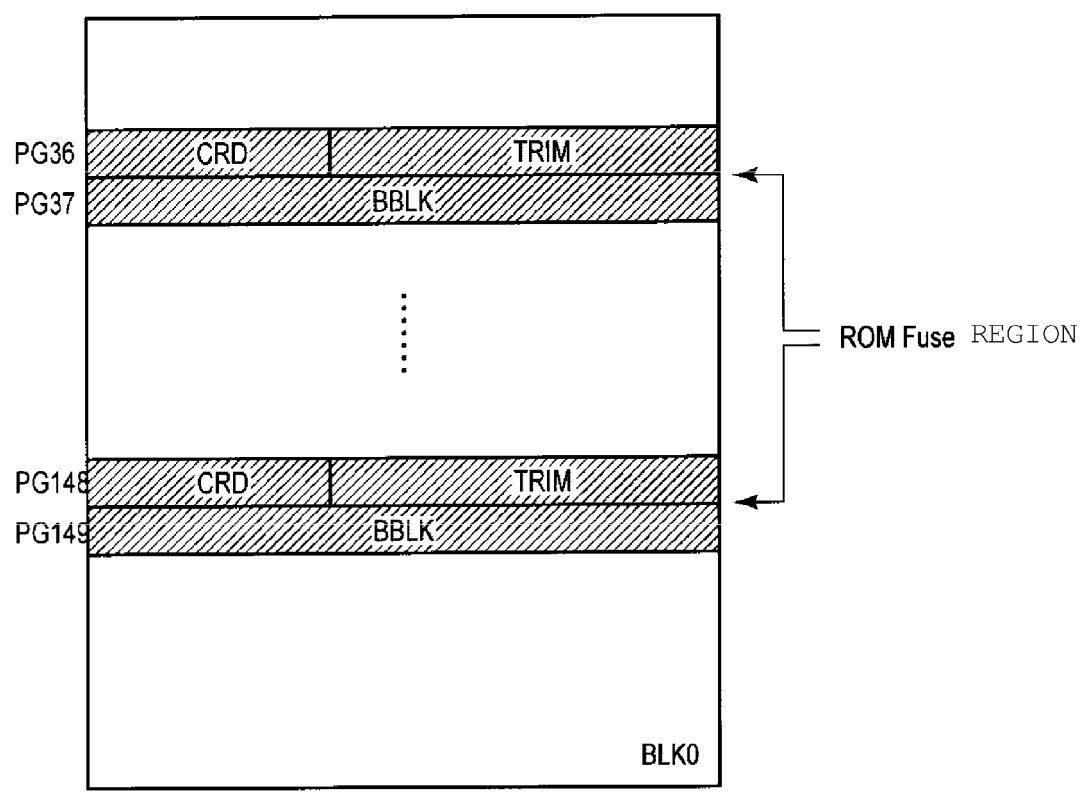
FIG. 29 is a schematic diagram of a block according to modification examples of the first to fifth embodiments.

Thus, in the ROM fuse region described referring to FIG. 5, the bad block information BBLK, the column redundancy information CRD and the trimming information TRIM are retained on one page, but in the case of the voltage sensing method, the bad block information BBLK, the column redundancy information CRD and the trimming information TRIM are retained on two pages. This is shown in FIG. 29. FIG. 29 is a schematic diagram of a ROM fuse block when the voltage sensing method is used.

As shown in FIG. 29, two pages PG36 and PG37 are allocated to the word line WL2 of the string unit SU2, for example. Further, the column redundancy information CRD and the trimming information TRIM are retained on the page PG36. Further, the bad block information BBLK is retained on the page PG37.

Further, two pages PG148 and PG149 are allocated to the word line WL2 of the string unit SU9. Further, the column redundancy information CRD and the trimming information TRIM are retained on the page PG148. Further, the bad block information BBLK is retained on the page PG149.

Accordingly, for example, when the first embodiment is applied to the voltage sensing method, first, data is simultaneously read from both of the pages PG36 and PG148, and the column redundancy information CRD and the trimming information TRIM are settled. Then, data is simultaneously read from the page PG37 and PG149, and the bad block information BBLK is settled.

6.7 Other Modification Examples

Figure 30:
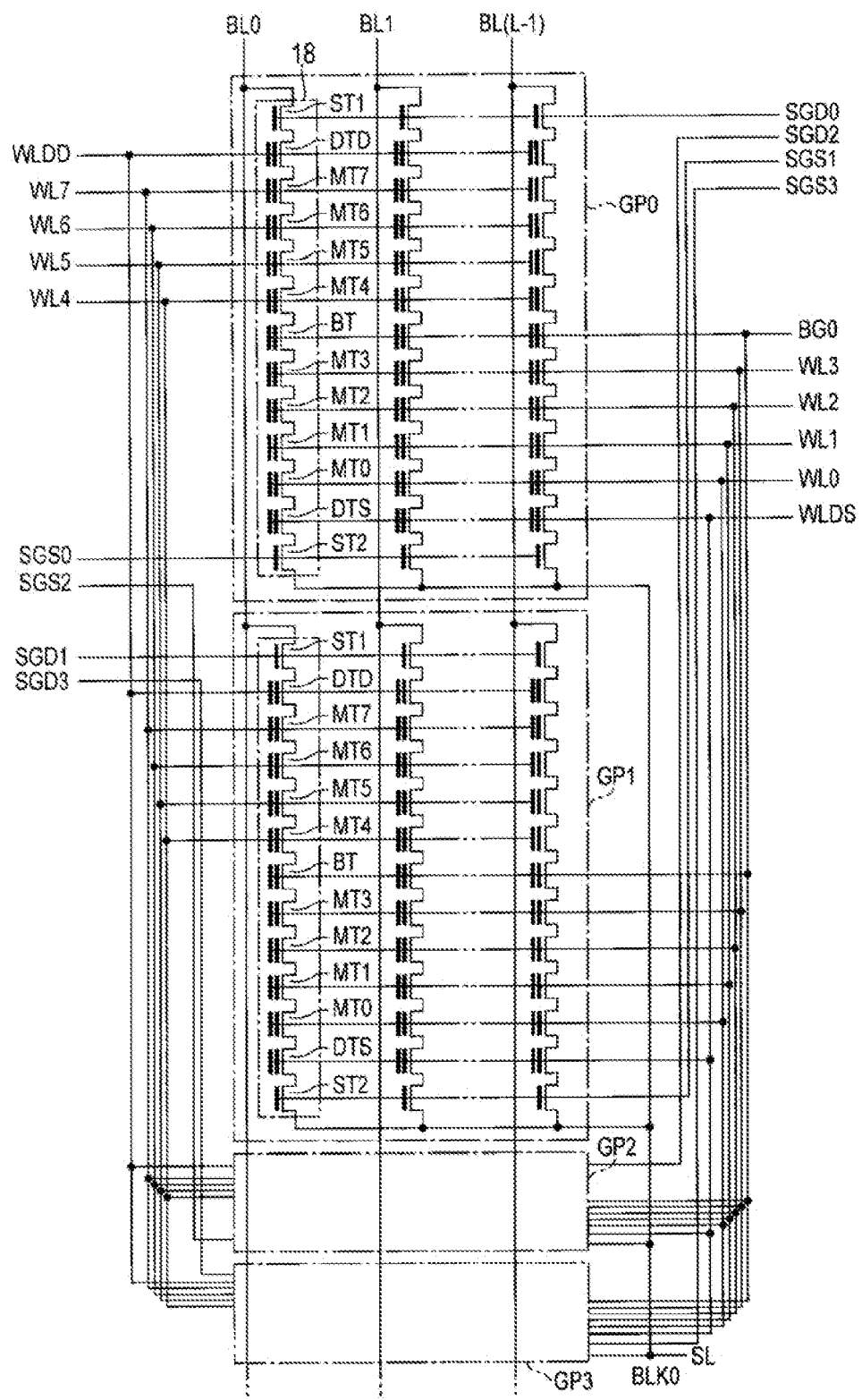
FIG. 30 is a circuit diagram of a memory cell array according to modification examples of the first to fifth embodiments.

Further, in the above embodiments, the opening defect of the memory hole is described as an example of a defect, but different defects may be present. Further, the memory cell array shown in FIG. 2 may have a configuration shown in FIG. 30. FIG. 30 is a circuit diagram of the block BLK0. The other blocks BLK1 to BLK3 may have the same configuration. As shown in FIG. 30, the word lines WL0 to WL3, a dummy word line WLDD adjacent to the word WL0, the back gate line BG, even select gate lines SGD0 and SGD2, and odd-numbered select gate lines SGS1 and SGS3 are extracted to one end side of the memory cell array 111. On the other hand, the word lines WL4 to WL7, a dummy word line WLDS adjacent to the word WL7, even select gate lines SGS0 and SGS2, and odd select gate lines SGD1 and SGD3 are extracted to the other end side opposite to the one end side of the memory cell array. Such a configuration may also be used. In this configuration, for example, the row decoder 112 that selects the word lines WL may be divided into two row decoders, for example, and the divided two row decodes may be arranged to be opposite to each other with the memory cell array 111 being interposed therebetween. Further, the select gate lines SGD0, SGD2, SGS1 and SGS3, the word lines WL0 to WL3, the dummy word line WLDD and the back gate BG may be selected by one row decoder, and the select gate lines SGS0, SGS2, SGD1 and SGD3, the word lines WL4 to WL7, and the dummy word line WLDS may be selected by the other row decoder. According to the present configuration, it is possible to alleviate congestion of wirings such as select gate lines or word lines in a region between a peripheral circuit (row decoder or row driver) of a row system and the memory cell array 111.

Further, during writing, reading and erasing of data, the voltage value used in the above description is only an example, and may be appropriately changed. Further, in the above embodiments, each memory cell transistor TM may retain 1-bit data (binary data), 2-bit data (four valued data), or more bit data.

Further, the above embodiments are not limited to the NAND flash memory, and may be applied to overall semiconductor memory devices in a possible range.

Further, in the flowcharts described in the embodiments, the orders may be changed in a possible range.

The above embodiments include the following aspects.

[1] A semiconductor memory device including a memory cell array (111 in FIG. 2) that is capable of storing data in a nonvolatile manner; and a control section (141 in FIG. 2) that controls data access to the memory cell array, wherein the memory cell array retains the same data on a plurality of pages (PG18 and PG74 in FIGS. 5 and 6), and wherein the control section executes a reading operation for the plurality of pages (PG18 and PG74) that retain the same data to settle read data (S21 in FIG. 8 and t4 to t7 in FIG. 9).

[2] The semiconductor memory device according to [1], wherein the memory cell array includes ROM fuse regions (PG18 and PG74 in FIGS. 5 and 6) that include a plurality of pages that retain the same ROM fuse information, and wherein immediately after electric power is supplied to the semiconductor memory device, the control section (141) reads the same ROM fuse information from the plurality of pages without receiving a read command from the outside (S21 in FIG. 2: POR).

[3] The semiconductor memory device according to [2], wherein the ROM fuse information is retained in a first page and a second page (PG18 and PG74), and wherein when the ROM fuse information is read, the reading operation is executed for the first page and the second page (PG18 and PG74) at the same time (S21 in FIG. 8).

[4] The semiconductor memory device according to [2] wherein the memory cell array includes first and second string units (SU2 and SU9 in FIGS. 6 and 9); the first and second string units (SU2 and SU9) include a plurality of NAND strings (114), respectively; each of the NAND strings includes first and second selection transistors (ST1 and ST2 in FIG. 2) and a plurality of memory cell transistors (MT in FIG. 2) that are connected in series between the first and second selection transistors; gates of the first and second selection transistors in the first string unit (SU2) are commonly connected to first and second select gate lines (SGD2 and SGS2), respectively; gates of the first and second selection transistors in the second string unit (SU9) are commonly connected to third and fourth select gate lines (SGD9 and SGS9), respectively; and the same ROM fuse information is recorded in the first and second string units (SU2 and SU9) (FIGS. 5 and 6); and all of the first to fourth select gate lines (SGD2, SGD9, SGS2 and SGS9 in FIG. 9) are set to a logic "H" level when the ROM fuse information is read.

[5] The semiconductor memory device according to [3] further includes a sense amplifier (113 in FIG. 4) that reads data from the memory cell array under the control of the control unit, wherein the sense amplifier executes data strobe over a plurality of times when the ROM fuse information is read and lockouts bit lines according to cell currents (FIG. 9).

[6] The semiconductor memory device according to [2] wherein the ROM fuse information is retained in a first page and a second page (PG18 and PG74), and wherein when the ROM fuse information is read, first, a reading operation is executed to the first page (S30 in FIG. 15), and then, the reading operation is executed to the second page (S32 in FIG. 15).

[7] The semiconductor memory device according to any one of [3], [5] and [6], wherein the memory cell array includes a plurality of blocks that are a set of memory cells and are usable as an erasing unit, and the first page and the second page (PG 18 in BLK0 to BLK1) are included in different blocks (FIG. 17).

[8] A controller that controls the semiconductor memory device according to any one of [1] to [7], including a second control section (CPU 230 in FIG. 1) that reads defect information in the memory cell array from the semiconductor memory device; and an internal memory (RAM 220 in FIG. 1) that retains the defect information (FIG. 19), wherein the second control section (CPU 230) writes the same data on a plurality of pages with respect to the semiconductor memory device, according to the defect information (FIG. 20).

[9] The controller according to [8], wherein the defect information relates to an opening defect in a path through which a cell current flows.

[10] A controller that controls the semiconductor memory device according to any one of [1] to [7], including: a second control section (CPU 230 in FIG. 1) that writes the same management information on a plurality of pages with respect to the semiconductor memory device (FIG. 22).

[11] A memory system including the semiconductor memory device according to any one of [1] to [7]; and the controller according to any one of [8] to [10].

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a memory cell array that is capable of storing data in a nonvolatile manner, the memory cell array including first and second memory strings that are connected to a common bit line, the first string including a first selection transistor and the second string including a second selection transistor; and
a control section configured to control access to the memory cell array,
wherein the memory cell array stores management data redundantly in a plurality of pages, and
wherein the control section is configured to execute a reading operation on the plurality of pages that store the management data to read the management data by applying a positive voltage to gates of the first and second selection transistors at the same time.

2. The semiconductor memory device according to claim 1, wherein the memory cell array includes at least first and second string units each including a plurality of memory strings in each of which a plurality of memory cells are connected in series, and the management data is stored redundantly in first and second pages, the first page being located in the first string unit and the second page being located in the second string unit.

3. The semiconductor memory device according to claim 2, wherein the first and second string units share the same plurality of word lines, each of which is commonly connected to one memory cell in each memory string of the first string unit and one memory cell in each memory string of the second string unit.

4. The semiconductor memory device according to claim 3, wherein the first and second pages include memory cells of the first and second string units, respectively, that are connected to the same word line.

5. The semiconductor memory device according to claim 3, wherein the first and second pages include memory cells of the first and second string units, respectively, that are connected to different word lines.

6. The semiconductor memory device according to claim 1, wherein the memory cell array includes a first block of memory cells all of which are erased together during an erasing operation and a second block of memory cells all of which are erased together during an erasing operation, and the management data is stored redundantly in first and second pages, the first page being located in the first block and the second page being located in the second block.

7. The semiconductor memory device according to claim 1, wherein immediately after electric power is supplied to turn on the semiconductor memory device, the control section reads the management data from the plurality of pages without receiving a read command from the outside.

8. The semiconductor memory device according to claim 1, wherein the control section is configured to execute a reading operation on the plurality of pages that store the management data at the same time.

9. The semiconductor memory device according to claim 1, wherein the control section is configured to execute a reading operation on the plurality of pages that store the management data at different times.

10. A method of accessing management data of a semiconductor memory device having a memory cell array that is capable of storing data in a nonvolatile manner and a control section configured to control access to the memory cell array, the memory cell array including first and second memory strings that are connected to a common bit line, the first string including a first selection transistor and the second string including a second selection transistor, said method comprising:
upon power on, executing a reading operation on the plurality of pages that redundantly store management data to read the management data by applying a positive voltage to gates of the first and second selection transistors at the same time; and
storing the management data in a register.

11. The method according to claim 10, wherein the memory cell array includes at least first and second string units each including a plurality of memory strings in each of which a plurality of memory cells are connected in series, and the management data is stored redundantly in first and second pages, the first page being located in the first string unit and the second page being located in the second string unit.

12. The method according to claim 11, wherein the first and second string units share the same plurality of word lines, each of which is commonly connected to one memory cell in each memory string of the first string unit and one memory cell in each memory string of the second string unit.

13. The method according to claim 12, wherein the first and second pages include memory cells of the first and second string units, respectively, that are connected to the same word line.

14. The method according to claim 13, wherein the reading operation is executed on the plurality of pages that store the management data at the same time.

15. The method according to claim 13, wherein the reading operation is executed on the plurality of pages that store the management data at different times.

* * * * *